United States Patent
Chia et al.

(10) Patent No.: US 11,140,800 B2
(45) Date of Patent: Oct. 5, 2021

(54) STRIP-BASED VENTILATION SOLUTION FOR ELECTRONIC EQUIPMENT

(71) Applicant: Cisco Technology, Inc., San Jose, CA (US)

(72) Inventors: Vic Hong Chia, Sunnyvale, CA (US); George Edward Curtis, San Jose, CA (US); Adriana del Pilar Rangel, Campbell, CA (US); Keith Frank Tharp, San Jose, CA (US); Alpesh Umakant Bhobe, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 74 days.

(21) Appl. No.: 16/255,229

(22) Filed: Jan. 23, 2019

(65) Prior Publication Data
US 2020/0236825 A1    Jul. 23, 2020

(51) Int. Cl.
| H05K 9/00 | (2006.01) |
| G06F 1/20 | (2006.01) |
| H05K 7/14 | (2006.01) |
| H05K 7/20 | (2006.01) |

(52) U.S. Cl.
CPC .......... *H05K 9/0007* (2013.01); *G06F 1/206* (2013.01); *H05K 7/1489* (2013.01); *H05K 7/20* (2013.01)

(58) Field of Classification Search
CPC ....... H05K 9/0007; H05K 7/1489; H05K 7/20
See application file for complete search history.

(56) References Cited

U.S. PATENT DOCUMENTS

| 5,201,855 A * | 4/1993 | Ikola ............... H01R 13/17 439/607.14 |
| 6,590,784 B2 | 7/2003 | Wortman et al. |
| 6,697,248 B1 * | 2/2004 | Luch ............... H05K 9/0015 361/118 |
| 6,944,019 B2 | 9/2005 | King et al. |
| 7,232,193 B2 | 6/2007 | Cunningham et al. |
| 7,609,517 B2 * | 10/2009 | Sun ............... H05K 7/20727 361/690 |
| 7,643,290 B1 * | 1/2010 | Narasimhan ....... H05K 7/20727 361/690 |
| 7,927,144 B2 | 4/2011 | Feldman et al. |
| 8,270,162 B2 * | 9/2012 | Peng ............... H05K 9/0041 361/693 |

(Continued)

OTHER PUBLICATIONS

Pictures of Cisco Catalyst 9300-48 UPOE, available for sale since Sep. 2013, 4 pages.

*Primary Examiner* — Rockshana D Chowdhury
*Assistant Examiner* — Douglas R Burtner
(74) *Attorney, Agent, or Firm* — Edell, Shapiro & Finnan, LLC

(57) ABSTRACT

An apparatus suitable for providing ventilation and electromagnetic interference (EMI) containment for a computing device includes a first strip and a second strip. The first strip is sized to span ventilation openings of a computing device covering. The second strip intersects the first strip while also spanning the ventilation openings. Thus, the first strip and the second strip cooperate to define airflow openings within the ventilation openings, the airflow openings being sized to inhibit EMI from exiting the computing device via the ventilation openings.

20 Claims, 13 Drawing Sheets

(56) References Cited

U.S. PATENT DOCUMENTS

| | | | | |
|---|---|---|---|---|
| 8,613,632 B1* | 12/2013 | Nichols | ............... | H01R 13/6587 |
| | | | | 439/607.21 |
| 8,804,374 B2* | 8/2014 | Gilliland | ............... | H05K 9/0041 |
| | | | | 361/818 |
| 8,890,004 B2* | 11/2014 | Wickes | ................ | H05K 9/0009 |
| | | | | 174/382 |
| 9,615,492 B2* | 4/2017 | Brodsky | ............... | H05K 9/0015 |
| 9,622,338 B2 | 4/2017 | Song et al. | | |
| 9,927,852 B2* | 3/2018 | Chia | .................. | H05K 7/20563 |
| 10,703,490 B2* | 7/2020 | Engelhardt | ........ | H05K 7/20554 |
| 10,716,175 B2* | 7/2020 | Hoogland | ............. | H05B 6/766 |
| 2002/0196094 A1* | 12/2002 | Skinner | ..................... | G06F 1/20 |
| | | | | 333/12 |
| 2003/0117786 A1* | 6/2003 | Chang | .................. | H05K 9/0041 |
| | | | | 361/818 |
| 2011/0244177 A1* | 10/2011 | Nasstrom | ........... | B29D 99/0089 |
| | | | | 428/116 |
| 2013/0333941 A1* | 12/2013 | Snider | ................... | H05K 9/0007 |
| | | | | 174/535 |
| 2016/0081220 A1 | 3/2016 | Chia et al. | | |
| 2016/0128230 A1 | 5/2016 | Lam et al. | | |
| 2019/0027192 A1* | 1/2019 | Tanzer | ............... | G11B 33/1493 |
| 2019/0075677 A1* | 3/2019 | Ehlen | .................. | H05K 7/1492 |
| 2019/0200487 A1* | 6/2019 | Coteus | ................. | H05K 7/1491 |
| 2020/0389995 A1* | 12/2020 | Hanssen | ................ | H05K 7/20 |

\* cited by examiner

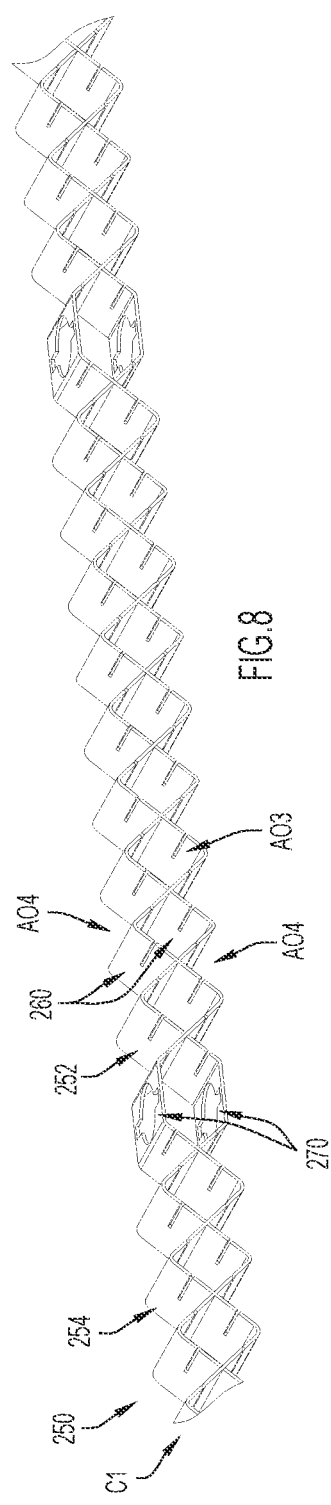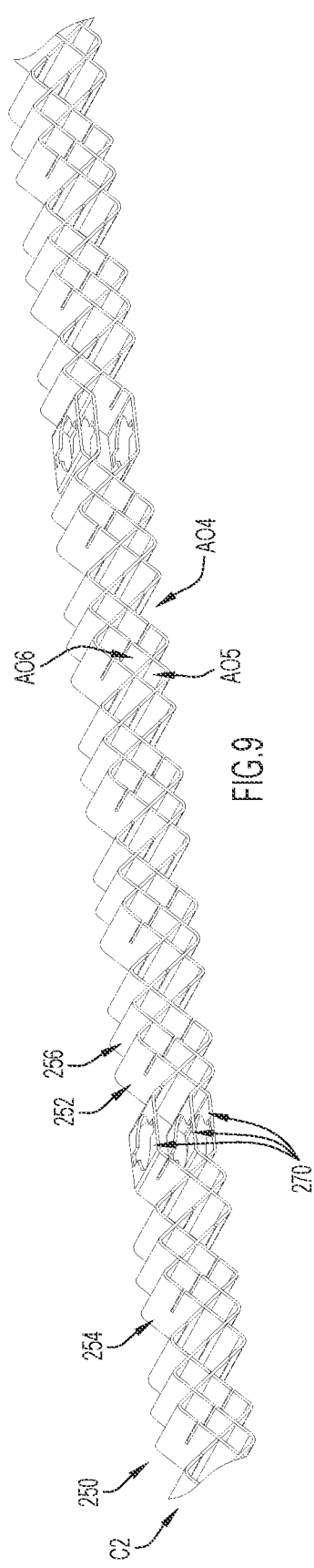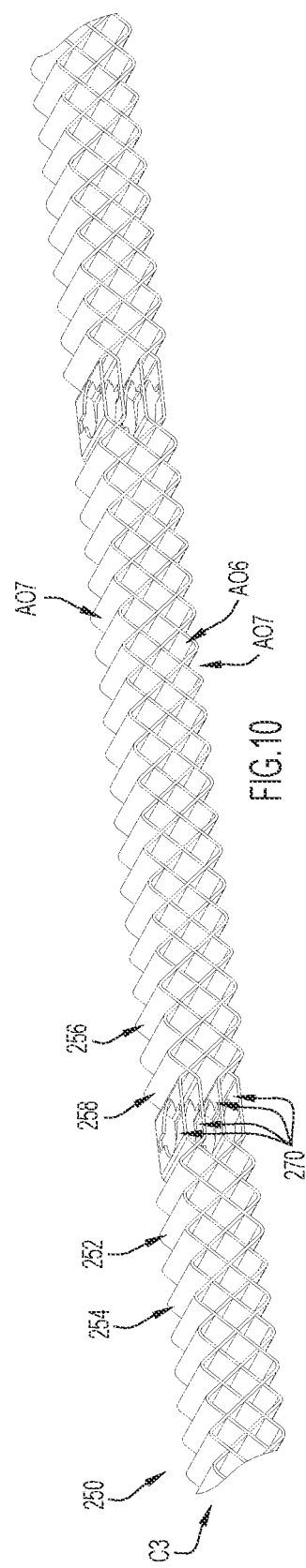

STRIP-BASED VENTILATION SOLUTION FOR ELECTRONIC EQUIPMENT

TECHNICAL FIELD

The present disclosure relates to high performance and high density computing solutions, such as line cards and computing blades, and in particular to cooling these computing solutions while providing optimized electromagnetic interference (EMI) shielding.

BACKGROUND

Over the past several years, the information technology field has seen a tremendous increase in the performance of electronic equipment coupled with a decrease in geometric floor space to house the equipment. Further, increased performance requirements have led to increased energy use, resulting in increased heat dissipation within the crowded floor space. Put another way, application-specific integrated circuit (ASIC)/field-programmable gate array (FPGA) technology has been advancing per Moore's law, while, unfortunately, cooling technology (e.g., fan technology) has not improved at the same pace (e.g., due to limitations associated with acoustic and thermal impedance). Moreover, cooling passages are often limited by electromagnetic interference (EMI) constraints, which often limit the size of openings that can be included on a computing device's covering. As a result, there is a demand for improved thermal management solutions for computing components and/or computing components with improved thermal characteristics.

BRIEF DESCRIPTION OF THE DRAWINGS

FIG. 8 depicts a front perspective view of the customizable EMI containment component of FIG. 6 in a first configuration.

FIG. 9 depicts a front perspective view of the customizable EMI containment component of FIG. 6 in a second configuration.

FIG. 10 depicts a front perspective view of the customizable EMI containment component of FIG. 6 in a third configuration.

FIG. 11 depicts a front view the computing device of FIG. 1, the front view showing the faceplate while the customizable EMI containment of FIG. 6 is installed in the computing device in its second configuration.

FIG. 12 depicts a front view of the faceplate of FIG. 11 installed on the computing device of FIG. 1 while the customizable EMI containment of FIG. 6 is installed on the computing device in its fourth configuration.

Like reference numerals have been used to identify like elements throughout this disclosure.

DESCRIPTION OF EXAMPLE EMBODIMENTS

Overview

Figure 1:
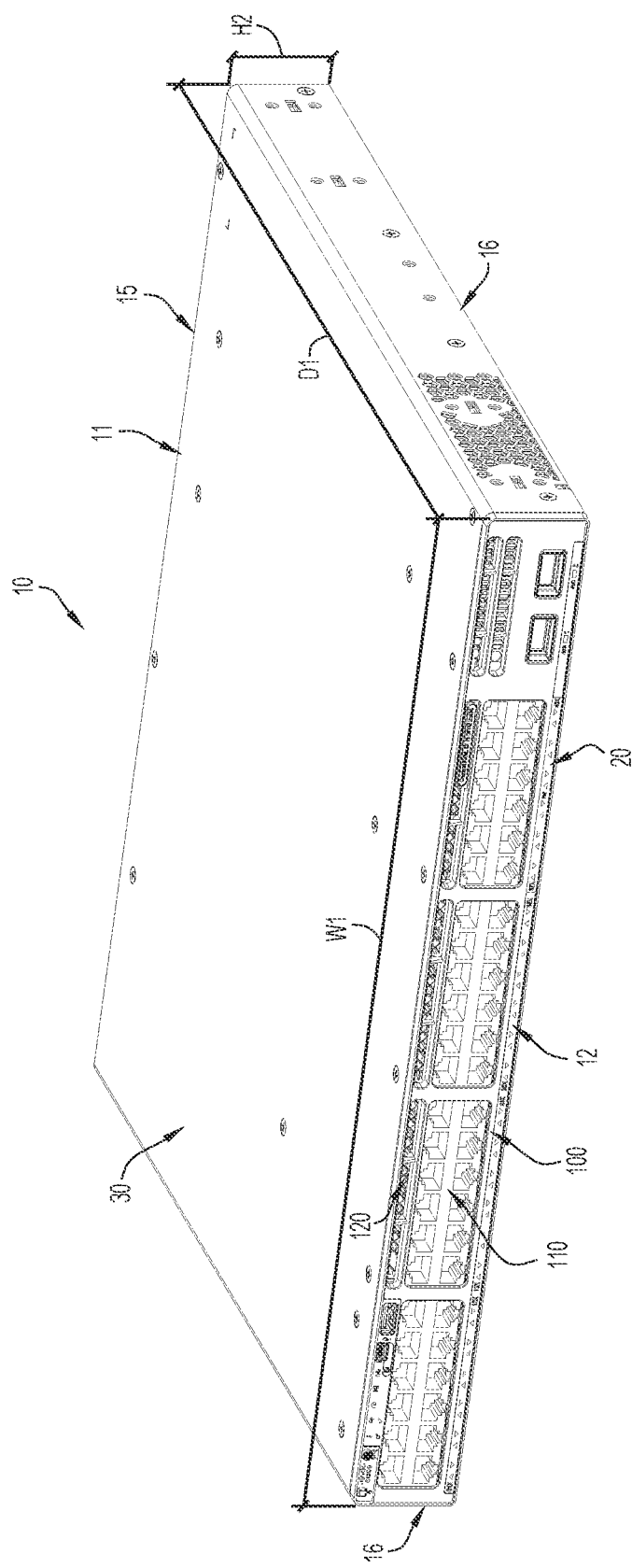
FIG. 1 illustrates a top perspective view of an example embodiment of a computing device on which the ventilation solution presented herein may be installed, according to an example embodiment.

The ventilation solution presented herein may increase cooling for computing components of a computing device while attenuating electromagnetic interference (EMI) containment generated by these computing components. The solution may be embodied in at least an apparatus for providing ventilation and electromagnetic interference (EMI) attenuation for a computing device, a computing device with enhanced cooling, and methods for installing or forming the same.

According to one example embodiment, an apparatus presented herein includes a first strip and a second strip. The first strip is sized to span ventilation openings of a computing device covering. The second strip intersects the first strip while also spanning the ventilation openings. Thus, the first strip and the second strip cooperate to define airflow openings within the ventilation openings, the airflow openings being sized to attenuate EMI generated by the computing device.

Example Embodiments

A ventilation solution that increases airflow while maintaining suitable electromagnetic interference (EMI) attenuation is presented herein. The solution includes an EMI containment component that is installed in a ventilation area of a computing device and defines airflow openings for ventilation in the ventilation area. The airflow openings can define an open air ratio greater than 90%, if not greater than 95%, with respect to an airflow direction through the ventilation area, insofar as the term "open air ratio" is used to denote the percentage of a space that remains open for ventilation along an airflow direction. Moreover, the EMI containment component is adjustable or customizable to ensure that the solution provides suitable EMI containment for any given computing device. Consequently, the EMI containment component may provide enhanced airflow for computing components encased within a wide variety of casings/envelopes while also providing suitable EMI containment for the computing components. In turn, the enhanced airflow may allow air-cooled electronic equipment to run at a higher power and/or performance for a given footprint (i.e., for a particular enclosure/housing size).

At least because the total power dissipation of electronic equipment has been creeping up over time while the footprint or size of the electronic equipment remains relatively constant, thermal cooling is a constant and ever-evolving challenge. Moreover, in systems cooled with forced air, the number of electronic components, such as application-specific integrated circuits (ASICs) and field-programmable gate arrays (FPGAs), has been advancing per Moore's law, but fan technology has been advancing at a slower pace due to at least acoustic and thermal impedance issues associated with denser/hotter systems. Thermal cooling is only further impeded by high power optics that are often included at the front end of computing devices and add additional thermal burden to forced airflows. These optics heat the forced air and, thus, reducing the effective cooling provided by the airflows to heatsinks on heat sources disposed behind the optics.

Often, manufacturers attempt to resolve these complex thermal cooling challenges by experimenting with patterns of perforations in a metal faceplate. Unfortunately, creating patterns of perforations is expensive and limited by both machining tolerances and the structural integrity of materials. Additionally, some computing devices, such as high performance network systems, run at higher frequencies (e.g., gigabit frequencies) and, thus, the sizes of the perforations must remain relatively small to attenuate EMI radiation. Due to these limitations, thermal cooling advances achieved with machined perforations typically only provide small improvements in airflow. Moreover, often advances in EMI attenuation correspond with decreases in thermal cooling and vice versa, thus, machining perforations in metal faceplates rarely provides an ideal solution for cooling and EMI containment/attenuation.

By comparison, the ventilation solution presented herein provides a ventilation solution that maximizes airflow into a computing device while also ensuring attenuation of EMI radiation and, thus, resolves these competing issues. Moreover, the ventilation solution presented herein is cost effective in terms of materials and manufacturing. As mentioned, the ventilation solution presented herein utilizes an EMI containment component and this component is separate and distinct from the faceplate. Instead, the EMI containment component includes at least two intersecting metal strips that sit behind a faceplate. The EMI containment component can manufactured relatively cheaply (at least as compared to perforated metal faceplates) and can be mounted on metal posts so that the EMI containment component, together with the posts and a housing/envelope of a computing device, can complete a Faraday cage around the computing device. Since the EMI containment component is adjustable or customizable, the Faraday cage is also adjustable or customizable with respect to electronic frequencies of EMI produced by a particular computing device. Advantageously, since the Faraday cage is formed without the faceplate, the faceplate need not shield EMI and can be manufactured with relatively imprecise tolerances and features. In fact, since the ventilation solution presented herein creates the continuous Faraday cage without a faceplate, a faceplate used with a computing device implementing the ventilation solution presented herein need not even be metal. Instead, the faceplate may be plastic, which may provide significant cost savings.

In order to describe embodiments of the ventilation solution presented herein, various positional/orientation terminology is used herein. For example, terms such as "left," "right," "top," "bottom," "front," "rear," "side," "height," "length," "width," "upper," "lower," "interior," "exterior," "inner," "outer," "depth," and the like as may be used. However, it is to be understood that these terms merely describe points of reference and do not limit the ventilation solution presented herein to any particular orientation or configuration. For example, the terms "height," "width," and "depth" may be used to describe certain embodiments presented herein, but it is to be understood that these terms are not intended to limit the example embodiments described herein to specific implementations. In fact, the embodiments described with terms "height," "width," and "depth" may be suitable to be repositioned between vertical orientations and horizontal orientations (i.e., the embodiments may be rotated 90 degrees about an axis extending through a front and back of the embodiments). Thus, for example, dimensions described herein as height may, in some orientations, denote a width and dimensions described herein as width may, in some orientations, denote a height.

Reference is now made to FIG. 1, which illustrates an example embodiment of a switch 10 that includes the ventilation solution presented herein. The depicted switch 10 is a single rack unit (1U) switch that is suitable for a modular data center/blade chassis; however, it is to be understood that this switch is merely an example of a computing device that can include/incorporate the ventilation solution presented herein. That is, although the ventilation solution presented herein is largely described herein in connection with a 1U switch, it is to be understood that this is merely one example of a computing device in which the ventilation solution presented herein may be incorporated. In other embodiments, the ventilation solution presented herein may be included or incorporated in computing devices for modular systems, such as field replaceable units (FRUs), server blades, and storage blades, as well as any other computing device that requires cooling and EMI containment. However, the ventilation solution presented herein may be most appropriate for higher power systems, such as systems operating at or near a total system power of at least 1200 W since lower power systems might be sufficiently cooled with less effective ventilation solutions. Moreover, the ventilation solution presented herein may be incorporated into computing devices of any size, including full-width 2U devices, half-width 2U devices, etc. In view of the foregoing, the switch 10 may also be referred to as computing device 10.

Although the switch 10 is merely one example of a computing device in which the ventilation solution presented herein may be included, generally, the switch 10 includes a housing 11 (also referred to as covering 11, enclosure 11, envelope 11, or variations thereof) that defines at least a back 15, sides 16, and a front 20 of the switch 10. The housing 11 may also define a top and bottom of the computing device; however, these parts are not labeled in FIG. 1. Put another way, the housing 11 defines external dimensions of the switch 10, which are denoted in FIG. 1 as depth "D1," width "W1," and height "H1." Since the depicted embodiment of switch 10 is sized to span a full-width slot of a blade enclosure/chassis, the external height H1 of the switch 10 may be approximately 1.75 inches, pursuant to industry standards. Meanwhile, D1 and W1 may be sized to span the full depth and width, respectively, of the particular chassis in which the switch 10 is mounted. For example, D1 may be approximately 13.9 inches, approximately 19.2 inches, or some other depth and W1 may be approximately 19 inches, approximately 23 inches, or some other width. However, as mentioned, in other embodiments the switch 10 may have a height H1, depth D1, and width W1 of any dimensions (e.g., to span a slot of any dimensions).

Figure 2:
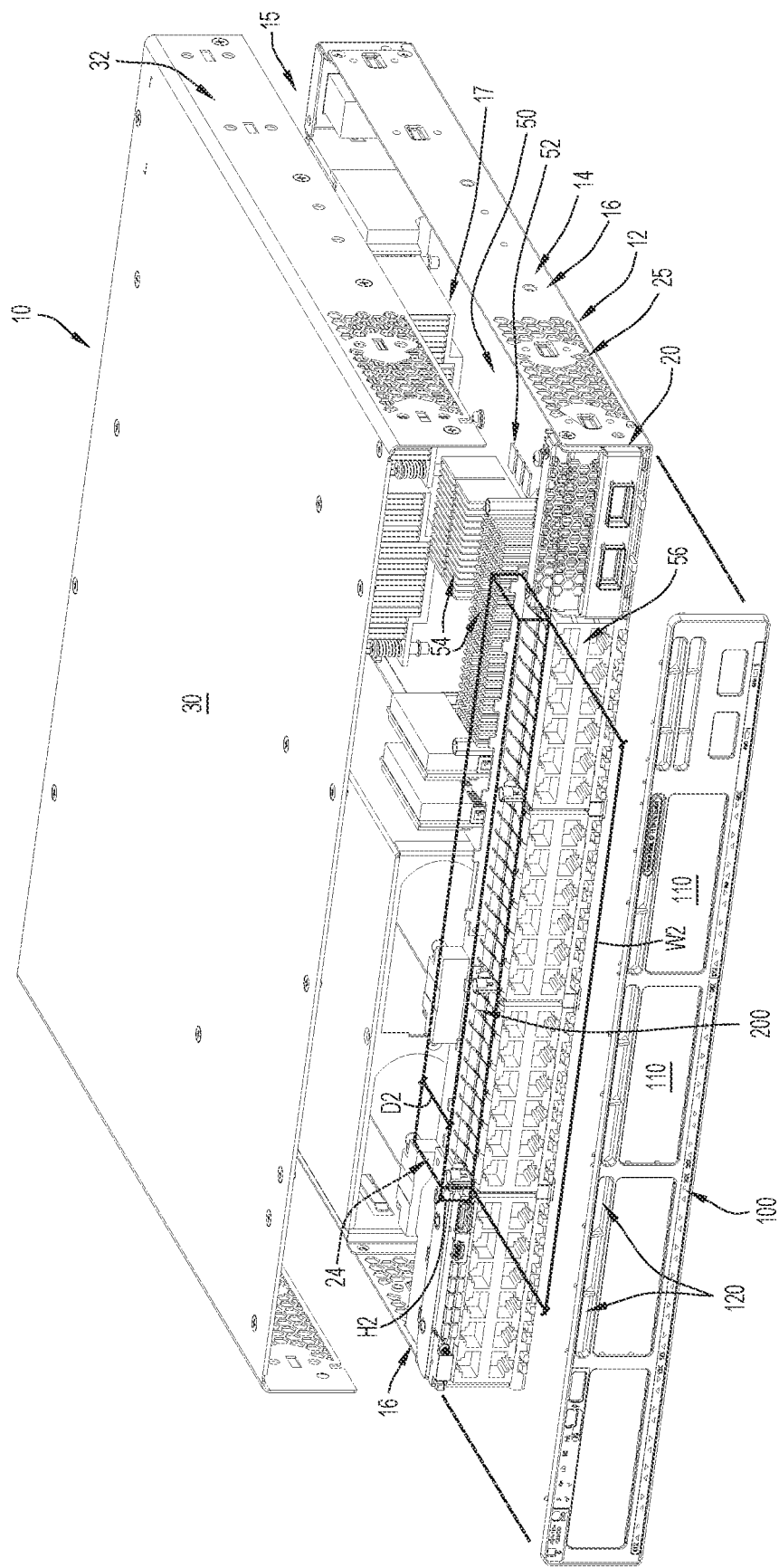
FIG. 2 illustrates a partially exploded, top perspective view of the computing device of FIG. 1 that illustrates one example embodiment of a ventilation solution that enhances thermal cooling while maintaining electromagnetic interference (EMI) attenuation.

Still referring to FIG. 1, but now with reference to FIG. 2 as well, the housing 11 is generally formed from a base plate 12 (also referred to as a bottom 12), sidewalls 14, a top cover 30, and a faceplate 100. The sidewalls 14 define the back 15 and the sides 16 of the switch 10, and may also define a portion of a front 20 of the switch 10. Thus, together, the base plate 12 and the sidewalls 14 define an open-top interior 17 in which computing/electronic components can be stored/installed. In the particular embodiment depicted in the Figures, a line card 50 is mounted on the base plate 12 within the interior 17 and a plurality of computing components 52 (also referred to as electrical components 52 at least because the computing components comprise at least electrical components) are mounted on/included on the line card 50. The computing components 52 that are significant heat sources may also include heat sinks 54 that extend upwards, away from the line card 50. Additionally, in the depicted embodiments, input/output modules (IOMs) 56 are installed on or adjacent the line card 50 at the front 20 of the switch 10. Generally, the IOMs 56 provide ports through which the computing components 52 can be accessed from an exterior of the computing device 10 (e.g., so that external computing devices can be operably coupled to the computing components 52). The computing components 52, the heat sinks 54, and the IOMs 56 may be formed in any manner now known or developed hereafter.

As can be seen best in the partially exploded view of FIG. 2, the top cover 30 and the faceplate 100 can be installed onto the sidewalls 14 in order to substantially enclose the computing components 52 within the interior 17 of the switch 10. More specifically, in the depicted embodiment, the faceplate 100 spans a front 20 of the switch 10 and the top cover 30 spans a top of the switch 10. The faceplate 100 may be connected to the remainder of housing 11 via any suitable connections included along the edges of the faceplate 100 (or anywhere else on the faceplate). However, since the front 20 of the switch 10 includes various features that provide access to the computing components 52—either physical access for a cooling media or operative access for a data connection—the faceplate 100 includes various openings, such as IOM openings 110 and ventilation openings 120 (also referred to as vent openings 120).

The cover 30, on the other hand, may be substantially solid and may include sides 32 that extend downwards over the sidewalls 14 at the sides 16 and/or back 15 of the switch 10. The sides 32 may mate with or be coupled to any portions of sidewalls 14 over which they extend so that top cover 30 forms a secure covering atop of the interior 17. Additionally or alternatively, the top cover 30 may be pivotally, slidably, or otherwise movably attached to the sidewalls 14. Regardless, the top cover 30 is not secured tightly against a top of the IOMs 56 (and may also be spaced from tops of the heat sinks 54). Instead, the top cover 30 is spaced apart from a top of the IOMs 56 in order to ventilation area 24 above the IOMs 56.

The ventilation area 24 provides a primary mechanical/physical pathway between the interior 17 of the switch 10 and an exterior of the switch 10 that allows for fluid communication between the interior 17 of switch 10 an exterior of the switch 10. That is, the ventilation area 24 defines a primary intake or inlet through which cooling gas, such as ambient air, may be drawn into the interior 17 of the switch 10. In this context, the word "primary" is intended to denote that the ventilation area 24 is the main conduit through which cooling air may enter the computing device 10; however, it need not be the only conduit and at least some embodiments may also include secondary ventilation. For example, in FIG. 2, the sidewalls 14 define a secondary ventilation area 25 on the sides 16 of the computing device 10.

Still referring to FIG. 2, in the depicted embodiment, the switch 10 includes four IOMs 56 and the ventilation area 24 spans across the three rightmost IOMs 56 (rightmost when FIG. 2 is viewed in landscape) so that the ventilation area 24 has a width "W2." Meanwhile, the ventilation area 24 has a height "H2" that spans from a top of the IOMs 56 to a bottom surface of the top cover 30. Thus, in the depicted embodiment, the ventilation area 24 spans only a portion of the front 20 of the switch 10. Put another way, H2 and W2 are smaller than H1 and W1, respectively. Additionally, the ventilation area 24 has a depth "D2" that is approximately equivalent to a depth of the IOMs 56. However, in other embodiments, the ventilation area 24 may span any portion of any portion of covering/housing 11. Moreover, in other embodiments, the ventilation area 24 need not be contiguous. For example, the ventilation area 24 might include a first portion on a front of a computing device and a second portion on the back (and/or a side) of the computing device. In embodiments where the entirety of ventilation area 24 is not disposed adjacent front 20, the housing 11 may be configured to receive multiple faceplates or include/define features (e.g., ventilation openings) that are similar to those included in faceplate 100.

In the depicted embodiment, the faceplate 100 is designed to align and mate with the front 20 of the switch 10. Thus, the faceplate 100 includes four IOM openings 110 to accommodate the four IOMs 56 and a set of ventilation openings 120 disposed above the three rightmost IOMs 56 (rightmost when FIG. 2 is viewed in landscape). That is, the faceplate 100 includes ventilation openings 120 that span latitudinally (e.g., width-wise), across an area of the faceplate 100 that aligns with the ventilation area 24. To ensure structural integrity, the depicted faceplate 100 includes nine ventilation openings 120 that span the ventilation areas and the ventilation openings 120 are separated by thin support columns; however, in other embodiments, the faceplate 100 may include any number of ventilation openings 120 (i.e., one or more).

Often, faceplates for modular computing devices are metal faceplates and the metal faceplates are machined in areas that align with ventilation areas, for example to create a honeycomb or hexagonal pattern of perforations in the metal faceplate. These patterns may be used in order to inhibit EMI from escaping the computing device (i.e., to attenuate EMI); however unfortunately, these patterns are expensive to create and, moreover, it is difficult to provide a large open air ratio with machined openings without jeopardizing the structural integrity of the faceplate. For example, often machined ventilation openings can have a maximum open air ratio of only 60% or 65%, insofar as the term "open air ratio" is used herein to describe the percentage of the ventilation area that is open when viewed along an airflow direction (i.e., orthogonally to a vertical plane (the length-height plane in the Figures)).

As is explained in further detail below, with the ventilation solution presented herein, an EMI containment component 200 can contain, or at least attenuate, EMI radiated by the computing device 10 and, thus, the faceplate 100 need not include machined ventilation openings 120. Instead, the ventilation openings 120 are unmachined ventilation openings, insofar as "unmachined" indicates that the ventilation openings 120 form unimpeded conduits between the ventilation area 24 and an area that is exterior of the computing device. That is, the ventilation openings 120 are entirely open. Consequently, the ventilation openings 120 provide an open air ratio of at least 90%, if not 95%, with respect to the ventilation area 24.

These unmachined ventilation openings 120 may provide a significant increase in airflow through the computing device. For example, fans associated with the computing device 10 (although not shown, fans may be included in the computing device 10 or included in a chassis/data center in which the computing device is housed) may experience a total airflow increase of at least approximately 25% due to the ventilation solution presented herein (i.e., due to the combination of the ventilation openings 120 and the EMI containment component). As a more specific example, in one instance, five fans created a system airflow of 40.9 cubic feet per minute (CFM) for a computing device with a perforated metal faceplate that provided an open air ratio of 60%. Then, when the five fans were operated with the same parameters for the same device, but with the metal faceplate replaced by the ventilation solution presented herein, the fans created a system airflow of 51.2 CFM.

Figure 3A:
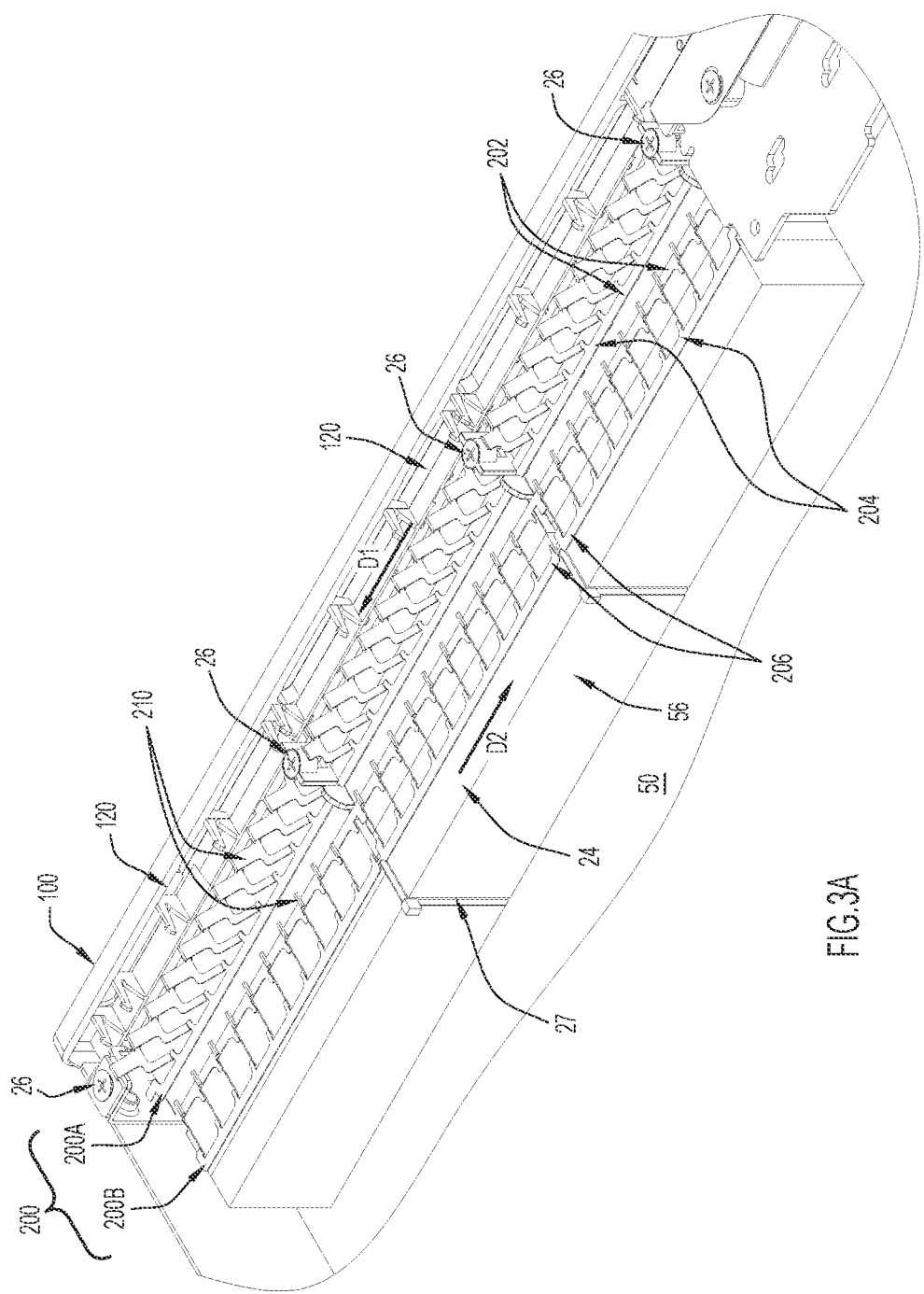
FIG. 3A illustrates a rear, top perspective view of a portion of an interior of the computing device of FIG. 1, the portion illustrating the ventilation solution included in the embodiment of FIG. 2.
Figure 3B:
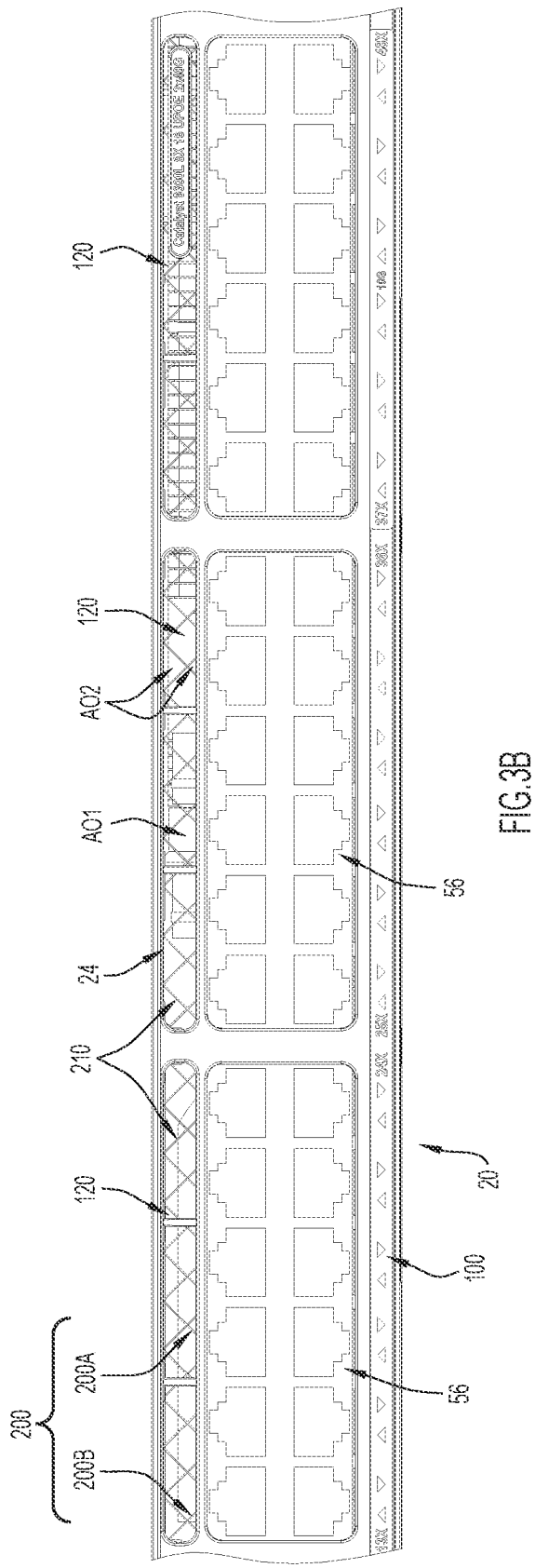
FIG. 3B illustrates a front view of a portion of a faceplate included on the computing device of FIG. 1, the portion of the faceplate being disposed in front of a ventilation area defined by the computing device of FIG. 1.

Now turning to FIGS. 3A and 3B for a description of one embodiment of an EMI containment component 200 that can be utilized to form the ventilation solution presented herein. Generally, the EMI containment component 200 is formed from two or more intersecting strips that extend through the ventilation area 24, behind the faceplate 100, to form airflow openings in the ventilation area 24. In some embodiments, such as the embodiment shown in FIGS. 7 and 8-10, the strips intersect by overlapping and overlocking. However, in the embodiment of FIGS. 3A and 3B, the EMI containment component 200 includes a first strip 200A and a second strip 200B that are spaced in the depth direction (e.g., along the depth D2 of the ventilation area 24) and intersect because the first strip 200A and the second strip 200B intersect when viewed orthogonally to a vertical plane (e.g., the length-height plane in the Figures). For the purposes of this application, this type of intersecting may be referred to as intersecting in a non-depth direction.

Due to this non-depth intersecting, the first strip 200A and second strip 200B intersect to form airflow openings "AO1" between the first strip 200A and the second strip 200B when viewed from a front view, such as the front view provided by FIG. 3B (which shows the ventilation area 24 as seen through a faceplate 100). Additionally, the first strip 200A and second strip 200B cooperate with the housing 11 to form airflow openings "AO2" above and below the EMI containment component 200. In the depicted embodiment, the first strip 200A and the second strip 200B intersect in an X-shaped configuration and, thus, the first airflow openings AO1 are substantially square shaped (or equilaterally diamond-shaped, depending on perspective) and the second airflow openings AO2 are substantially triangular. In at least some embodiments, openings AO2 may be half the size of openings AO1. However, in other embodiments, airflow openings AO1 and AO2 may be any size and may also be any shape.

Figure 4:
FIG. 4 illustrates a top plan view of a portion of an EMI containment component included in the ventilation solution of FIGS. 3A and 3B.

Now referring to FIGS. 3A and 3B in combination with FIG. 4, in the depicted embodiment, strips 200A and 200B are identical strips that each include resilient fingers 210. However, the resilient fingers 210 of strip 200A and extend upwards from a base 202 in opposite direction than the resilient fingers 210 of strip 200B. That is, the fingers 210 on the first strip 200A extend upwards in a first direction D1 and the fingers 210 on the second strip 200B extend upwards in a second direction D2 that is opposite to the first direction D1. For example, the fingers 210 on the first strip 200A may extends towards a top-left corner of the switch 10 and the fingers 210 on strip 200B may extends towards a top-right corner of the switch 10.

The fingers 210 each substantially span the height H2 of the ventilation area 24 and, in fact, may be taller than the height H2 of the ventilation area 24 but may be compressible and/or pivotable so that when the cover 30 is installed atop the ventilation area 24, the resilient fingers 210 can fold or compress into the ventilation area and still span the entire height H2 of the ventilation area. The fingers 210 may also be resilient so that the fingers 210 press against the cover 30 when the cover 30 compresses the fingers 210. This resiliency may ensure that the fingers 210 firmly abut the cover 30 when the cover 30 is installed atop the EMI containment component 250. In at least some embodiments, this connection between the fingers 210 and the cover 30 may help to form a Faraday cage for the switch 10, as is discussed in further detail below. Moreover, the flexibility or resiliency of the fingers 210 may allow the pitch of the fingers 210 to be adjusted with respect to the base 202 and/or the shape of the fingers 210 to be adjusted. These adjustments may allow the EMI containment component to achieve a desired shielding effectiveness when system is running at a particular EMI frequency range without diminishing the airflow passing through the ventilation area 24 (i.e., without decreasing the open air ratio of the ventilation area 24). That is, the fingers 210 can be customized with respect to an electronic frequency while still achieving the highest air flow rate.

As is shown in FIG. 4, in the depicted embodiment, the fingers 210 have an inverted-Y shape. In particular, the fingers 210 include a split base 211 (the top of the Y) that defines an opening 214 and a top extension 213 (the stem of the Y) that extends from a top, central section of the split base 211. In some embodiments, the entire fingers 210 may be resilient and/or flexible; however, in other embodiments, only the top extension 213 or the base 211 may be resilient and/or flexible. Moreover, in other embodiments, the fingers 210 may have any desirable shape, resiliency, size, depth, thickness, etc. to allow the EMI containment component to achieve a desired shielding effectiveness w without diminishing the airflow passing through the ventilation area 24 (i.e., without decreasing the open air ratio of the ventilation area 24).

Figure 5:
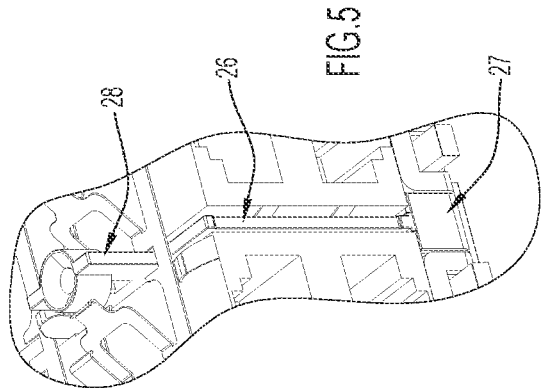
FIG. 5 illustrates side view of a post that supports the EMI containment component included in the ventilation solution of FIGS. 3A and 3B.

Turning back to FIGS. 3A and 3B, but now in combination with FIG. 5, to support the fingers 210, each base 202 includes finger supports 204 to which the fingers 210 may be connected. In some embodiments, this connection is pivotal or rotatable, but in other embodiments, the connection may be a fixed connection that supports the fingers 210 at a constant angle (and the fingers may be resilient to allow for movement). Additionally, the base 202 of each strip 200A, 200B includes post supports 206 that engage posts 26 included between the IOMs 56. In some embodiments, the connection between posts 26 and the post supports 206 may secure the strips 200A, 200B to a top surface of the IOMs 56. Additionally or alternatively, the bases 202 may be coupled to a top surface of the IOMs 56 in any manner (e.g., with an adhesive and/or fasteners).

Regardless of how the EMI containment component is secured atop the IOMs 56 (or between the IOMs 56 and the top cover 30), the posts 26 include a base section 27 that extends to the base plate 12 of the housing 11 and an engagement end 28 that engages the EMI containment component 200. Advantageously, both the posts 26 and the EMI containment component 200 (e.g., both strip 200A and strip 200B) are formed of metal and, thus, the posts 26 and EMI containment component 200 may, together with the housing 11, form a complete metal enclosure around the computing components 52 included in computing device 10. This complete metal enclosure can act as a complete or continuous Faraday cage to prevent EMI from escaping the computing device 10 (or at least attenuate radiated EMI) and enables the faceplate 100 to include the unmachined ventilation openings 120 (since the faceplate 100 need not contain EMI). That is, the Faraday cage will shield off electromagnetic field. Due to this Faraday cage configuration, in some embodiments, the faceplate 100 can be a plastic faceplate (since the faceplate is uninvolved in EMI containment), which may provide drastic costs savings as compared to metal, machined faceplates (for example, a machined, metal faceplate may cost approximately $50 while plastic faceplate may cost only $3).

Figure 6:
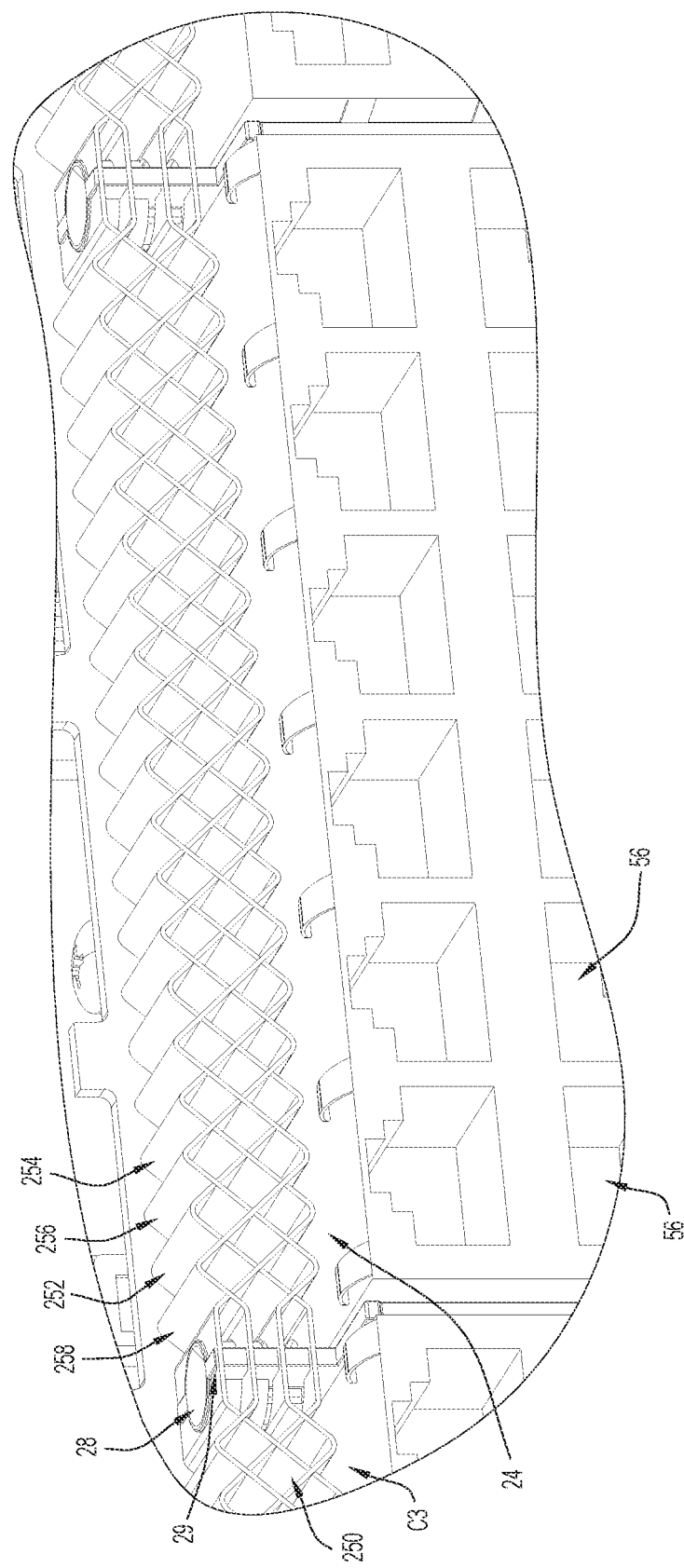
FIG. 6 depicts a front view of another example embodiment of an EMI containment component installed as one of the ventilation components for the computing device of FIG. 1, the EMI containment component of FIG. 6 being a customizable EMI containment component.

Now turning to FIG. 6 for a description of another embodiment of an EMI containment component 250 that can provide enhanced ventilation for a computing device 10 while also containing EMI. This embodiment is also depicted in at least FIGS. 7, 7A, 7B, and 8-10, which are described below. Like EMI containment component 200, EMI containment component 250 can be positioned in and span the ventilation area 24 of computing device 10. Moreover, and also like EMI containment component 200, EMI containment component 250 includes intersecting strips that connect to the housing 11 (directly and/or via engagement ends 28 of posts 26) to form a Faraday cage around the computing device 10 and may be adjustable or customizable to contain EMI of different frequencies. However, in contrast with EMI containment component 200, EMI containment component 250 includes two or more overlapping and interlocking strips and is customizable by adjusting the number of strips included in this overlapping and interlocking configuration.

Figure 7:
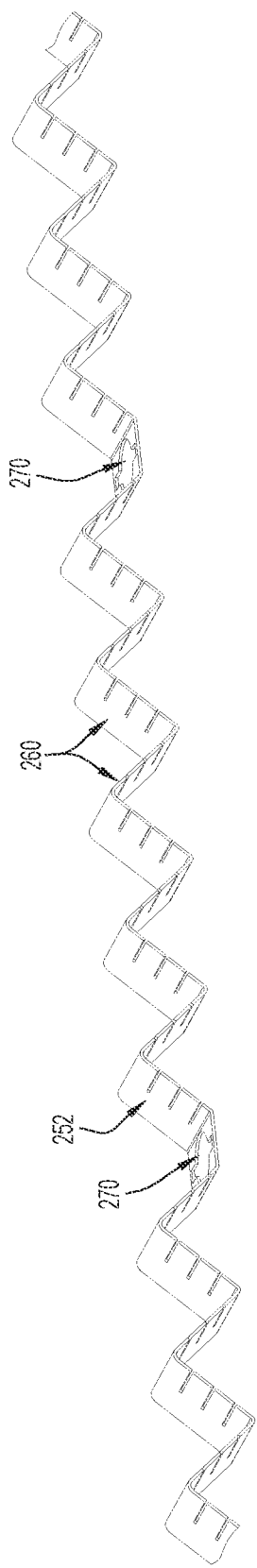
FIG. 7 depicts a front perspective view of a strip included in customizable EMI containment component of FIG. 6, according to an example embodiment.

Still referring to FIG. 6, but now in combination with FIG. 7, the EMI containment component 250 includes overlapping and interlocking strips at least because the various strips included in EMI containment component 250 span the ventilation area 24 at approximately the same depth (i.e., the strips span substantially the same depth-width plane). In FIG. 6, the EMI containment component 205 includes from four strips: a first strip 252, a second strip 254, a third strip 256, and a fourth strip 258. The strips each interlock and overlap with each other and, moreover, interlock and overlap with the engagement ends 28 of the posts 26 that are disposed between the IOMs 56, as is discussed in further detail below.

FIG. 7 shows a portion of the first strip 252 on its own in order to illustrate the shape and features of a strip included in EMI containment component 250. Notably, in the depicted embodiment, each of the strips is substantially similar and, thus, the description of strip 252 may be understood to apply to any of strip 252, strip 254, strip 256, and strip 258 unless otherwise indicated. With that in mind, generally, strip 252 is formed from sets of interlocking segments 260 that extend between engagement segments 270. Put another way, strip 252 includes engagement segments 270 that bound sets of interlocking segments 260. In the depicted embodiment, ten interlocking segments 260 are included between each pair of engagement segments 270; however, in other embodiments, engagement segments 270 may be included between any number of interlocking segments 260 (i.e., sets of interlocking segments may include any number of interlocking segments 260). Regardless, the sets of interlocking segments 260 form a triangular waveform shape. That is, each interlocking segment 260 extends diagonally between a top of the ventilation area 24 and a bottom of the ventilation area 24 and adjacent interlocking segments 260 extend in opposite directions.

Figure 7B:
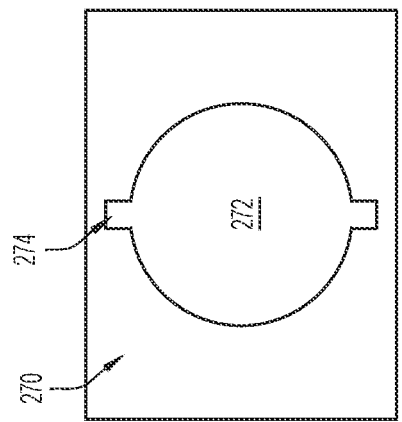
FIG. 7B depicts a top view of an engagement segment included in strips of the customizable EMI containment component of FIG. 6, according to an example embodiment.
Figure 7A:
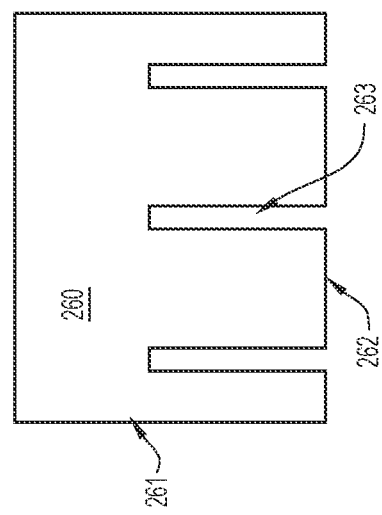
FIG. 7A depicts a top view of an interlocking segment included in strips of the customizable EMI containment component of FIG. 6, according to an example embodiment.

FIGS. 7A and 7B illustrate top plan views of an interlocking segment 260 and an engagement segment 270, respectively. As can be seen in FIG. 7A, the interlocking segment 260 includes a main body 261 and an edge 262 of the main body 261 defines external or edge slots 263 that can interlock with external/edge slots 263 included on another interlocking segment 260 from another strip. In the depicted embodiment, the main body 261 is a substantially planar, rectangular body and the slots 263 include three slots. The three slots 263 allow the depicted strip to interlock with three other strips (with each slot receiving one additional strip). However, in other embodiments, the interlocking segment 260 may include any number of slots, or any other features, so that the strip 252 can be interlocked with any number of strips. By comparison, the engagement segment 270 does not include edge/exterior slots and, instead, defines interior features that can secure the strip 252 to an engagement end 28 of a post 26. In particular, the engagement segment 270 defines a central opening 272 so that the engagement segment 270 is substantially annular. In some embodiments, the central opening 272 may secure the strip 252 to a post 26 on its own; however, in the depicted embodiment, the central opening 272 also includes/defines notches 274 that can engage slotted flanges 29 included on the engagement end 28 of posts 26 (see FIG. 6).

Now turning to FIGS. 8-10, but with continued reference to FIG. 6 as well, generally, the engagement segment 270 of each strip included in the EMI containment component 250 extends laterally (e.g., horizontally) between two interlocking segments 260 and defines features that can secure the strip 252 to an engagement end 28 of a post 26. As can seen in FIGS. 8-10, the interlocking segments 260 are arranged so that the engagement segments 270 of any strips included in the EMI containment component 250 are aligned, regardless of the number of strips included therein. To provide this alignment, the engagement segments 270 of different strips extend between interlocking segments 260 at different heights or longitudes.

For example, the first strip 252 may include engagement segments 270 that extend between bottom ends of interlocking segments 260 (e.g., at the trough of the triangular wave, adjacent the IOMs 56/top of the ventilation area 24) and the second strip 254 may include engagement segments 270 that extend between top ends of interlocking segments 260 (e.g., at the crest of the triangular wave, adjacent the top cover 30 of the computing device/top of the ventilation area 24), as can see in at least FIG. 8. Meanwhile, the third strip 256 and the fourth strip 258 may include engagement segments 270 that extend between partial wave segments formed by portions of the interlocking segments 260, as can be seen in at least FIG. 10. In particular, the engagement segments 270 of the third strip 256 may extend between partial interlocking segments 260 that extend upwards from a bottom (i.e., trough) of the triangular waveform. For example, the engagement segments 270 of the third strip 256 may be spaced from the engagement segments 270 of the first strip 252 by approximately ⅔ of the amplitude of the triangular waveform. Similarly, the engagement segments 270 of the fourth strip 258 may extend between partial interlocking segments 260 that extend downwards from a top (i.e., crest) of the triangular waveform. For example, the engagement segments 270 of the fourth strip 258 may be spaced from the engagement segments 270 of the second strip 254 by approximately ⅔ of the amplitude of the triangular waveform.

The longitudinal separation between the engagement segments 270 of the strips allows each strip (or, more specifically, the central opening 272 and notches 274 included in the engagement segments 270 of each strip) to engage a different opening included in the slotted flanges 29 of posts 26. That is, due to the longitudinal separation between the engagement segments 270 of the strips: (1) the engagement segments 270 of strip 252 may engage lowermost openings included in the slotted flanges 29; (2) the engagement segments 270 of strip 256 may engage the second lowest openings included in the slotted flanges 29; (3) the engagement segments 270 of strip 258 may engage the third lowest (or second highest) openings included in the slotted flanges 29; and (4) the engagement segments 270 of strip 254 may engage uppermost openings included in the slotted flanges 29. The engagement between the slotted flange 29 and strips 252, 254, 256, and 258 is shown best in FIG. 6.

Still referring to FIGS. 6 and 8-10, generally, the combination of interlockable interlocking segments 260 and laterally aligned, but longitudinally offset engagement segments 270 allows the EMI containment component 250 to be easily adjusted or reconfigured to include different number of strips. That is, due to at least the foregoing features, the EMI containment component can be easily rearranged between a first configuration "C1" with two strips (see FIG. 8), a second configuration "C2" with three strips (see FIG. 9), and a third configuration "C3" with four strips (see FIG. 10). In at least some embodiments, the EMI containment component might also be arranged in a configuration with a single strip (i.e., as shown in FIG. 7). The various strips may be offset (i.e., phase-shifted) so that their slots 263 align with each other and, thus, the different configurations shown in FIGS. 8-10 may be achieved by sliding the slots 263 of the interlocking segments 260 into engagement with each other until the strips are overlapped with each other (i.e., aligned with respect to the depth direction). Alternatively, one or more strips may be removed from the EMI component by moving the one or more strips away from the remaining strips in the depth direction until the strip disconnects from the remaining strips. However, in other embodiments, the strips may connect or disconnect with each other to provide overlapping and interlocking strips in any manner.

As is shown in FIG. 8, when the EMI containment component 250 is arranged in a first configuration "C1" that includes two strips, the triangular waveform formed by the interlocking segments 260 of the first strip 252 is offset from the triangular waveform formed by the interlocking segments 260 of the first strip 254 by approximately 180 degrees. That is, the triangular waveform of the first strip 252 is in antiphase with the triangular waveform of the second strip 254. Consequently, the interlocking segments 260 of the first strip 252 and the second strip 254 cooperate to define substantially square third airflow openings "AO2" between strip 252 and strip 254 and also define triangular fourth airflow openings "AO4" above or below strip 252 and strip 254. The fourth airflow openings AO4 may define openings with an area (with the area being measured when viewed from a front view) that is approximately half of the area provided by third airflow openings AO3. Notably, the shapes and sizes of airflow openings AO3 may be substantially similar (if not identical) to the airflow openings AO1 and AO2 provided by the EMI containment component 200 shown and described in connection with at least FIGS. 2-4.

In the first configuration C1, the airflow openings AO3 and AO4 are substantially symmetrical or regular, across the EMI containment component 250. By comparison, and now turning to FIG. 9, when the third strip 256 is added to the first strip 252 and the second strip 254, the third strip 256 creates asymmetrical or irregular pattern of airflow openings across a single wave of the triangular waveform (while still providing a pattern of airflow openings across the EMI containment component 250). More specifically, the triangular waveform formed by the interlocking segments 260 of the third strip 256 is offset from the triangular waveforms formed by the interlocking segments 260 of both the first strip 252 and the second strip 254 by approximately 90 degrees. Consequently, the interlocking segments 260 of the first strip 252, the second strip 254, and third strip 256 cooperate to define substantially square fifth airflow openings "AO5" and substantially rectangular airflow openings "AO6." Additionally, the first strip 252 and second strip 254 continue to define the triangular fourth airflow openings "AO4" above or below strip 252 and strip 254 in at least some locations.

The sixth airflow openings AO6 may define openings with an area that is approximately half of the area provided by third airflow openings AO3 (i.e., an area equal to the area defined by airflow openings AO4, albeit with a different shape). Meanwhile, the fifth airflow openings AO5 may define openings with an area that is approximately half of the area provided by sixth airflow openings AO6 (i.e., an area equal to the area defined by airflow openings AO4, albeit with a different shape).

Finally, and now turning to FIG. 10, when the fourth strip 258 is added to the first strip 252, the second strip 254, and the third strip 256, the fourth strip creates a new symmetrical or regular pattern of airflow openings across the EMI containment component 250. More specifically, the triangular waveform formed by the interlocking segments 260 of the fourth strip 258 is offset from the triangular waveform formed by the interlocking segments 260 of the third strip 256 by approximately 180 degrees (and, thus, is also offset from the triangular waveforms of both the first strip 252 and the second strip 254 by approximately 90 degrees, albeit in the opposite direction as compared to the 90 degree offset of the third strip 256). That is, the triangular waveform of the fourth strip 258 is in antiphase with the triangular waveform of the third strip 256. Consequently, the interlocking segments 260 of the first strip 252, the second strip 254, third strip 256, and the fourth strip 258 cooperate to define the substantially rectangular airflow openings "AO6" between the strips and also form triangular seventh airflow openings AO7 above and below the strips. The seventh airflow openings define openings with an area that is approximately half of the area provided by sixth airflow openings AO6.

Figures 11, 12:
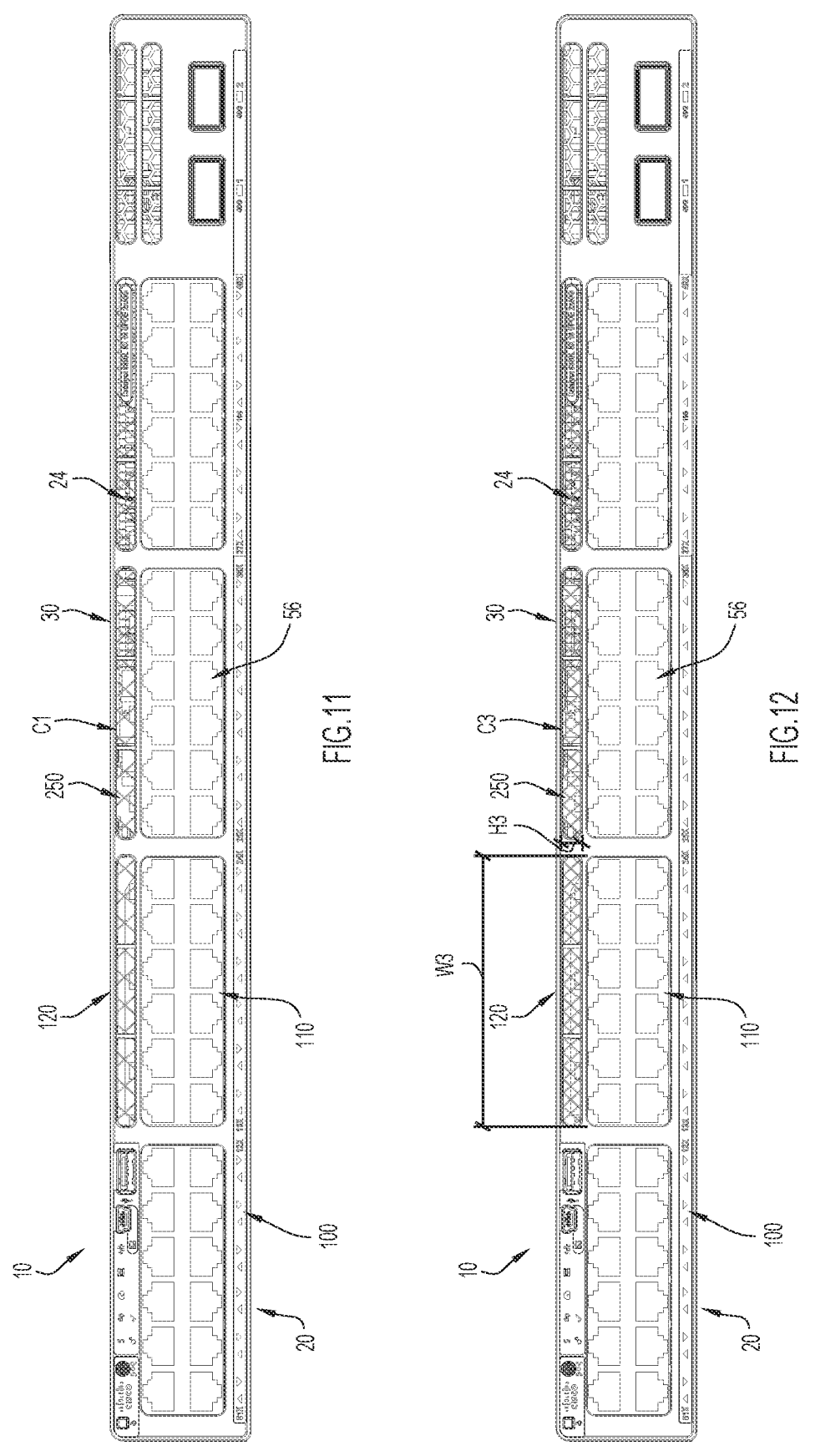

FIGS. 11 and 12 show front views of a computing device 10 including the EMI containment component 250 while in its first configuration C1 and while in its third configuration C3, respectively. Notably, regardless of its configuration, the EMI containment component 250 spans the ventilation area 24 and is sandwiched between the IOMs 56 and the top cover 30 of the computing device. Thus, the airflow openings defined by the EMI containment component 250 are aligned with the ventilation openings 120 defined by the faceplate 100 and help to define channels for a cooling media, such as ambient air, to flow into the computing device 10 (e.g., when drawn in by fans, which are not shown) through the front 20 of the computing device 10 (e.g., to the computing components 52 and/or their heat sinks 54).

In the embodiments depicted in FIGS. 11 and 12, the ventilation openings 120 have a height "H3" and a width "W3" that span a majority of the ventilation area 24. However, the ventilation openings 120 may not span the entire ventilation area 24 and, thus, the entirety of the strips included in the EMI containment component 250 may not be visible in the front views provided by FIGS. 11 and 12. That is, the height H3 of the ventilation openings 120 may be at least slightly smaller than the height H2 of the ventilation area 24 (see FIG. 2). Similarly, the sum of the widths W3 of all the ventilation openings 120 may be at least slightly smaller than the width W2 of the ventilation area 24 (see FIG. 2). For example, the height H3 and width W3 of the ventilation openings 120 may be configured to provide an open air ratio of approximately 90% or more with respect to the ventilation area 24. As mentioned, this high open air ratio may be facilitated by the EMI containment component 250, which provides EMI containment that ventilation openings 120 in a faceplate 100 are typically required to provide (but need not provided here).

Regardless of the open air ratio provided by the ventilation openings with respect to the ventilation area, the airflow openings may provide an open air ratio of at least 90% with respect to the ventilation openings 120, if not at least 95%. Denser (i.e., finer) configurations of the EMI containment component 250, such as configuration C3, may provide smaller open air ratios as compared to coarser (e.g., less dense) configurations, such as configuration C1. However, the denser configurations may still provide open air ratios above 90% with respect to the ventilation openings. Notably, since the EMI containment includes strips that have their main bodies (i.e., major dimension) oriented perpendicularly to a flow direction through the ventilation area, adding additional strips to EMI containment component only minimally impacts the open air ratio provided by the EMI.

However, since the size of the openings included in a Faraday cage may govern the frequencies of EMI that can escape the Faraday cage, adding additional strips may have a significant impact on EMI containment/attenuation. For example, if a computing device 10 including the ventilation solution presented herein is a low frequency system, a Faraday cage with relatively large/coarse openings may be sufficient to attenuate radiated EMI. That is, coarse openings may be sufficient to inhibit or prevent EMI from escaping the computing device, insofar as the term "inhibit" is intended to denote that EMI is mostly prevented. Thus, the EMI containment component may be installed into low frequency computing devices while in its first configuration C1 (which creates airflow openings AO3 and AO4 that are relatively large).

On the other hand, if a computing device 10 including the ventilation solution presented herein is a high frequency system, a Faraday cage with relatively small/fine openings may be required to inhibit EMI from escaping the computing device. Thus, the EMI containment component may be installed into high frequency computing devices while in its third configuration C3 (which creates airflow openings AO6 and AO7 that are relatively small). In at least some embodiments, reconfiguring the EMI containment component 250 from its first configuration C1 to its third configuration C3 may double the shielding effectiveness of the EMI containment component 250 (and adding additional strips could further increase the shielding effectiveness).

Figure 14:
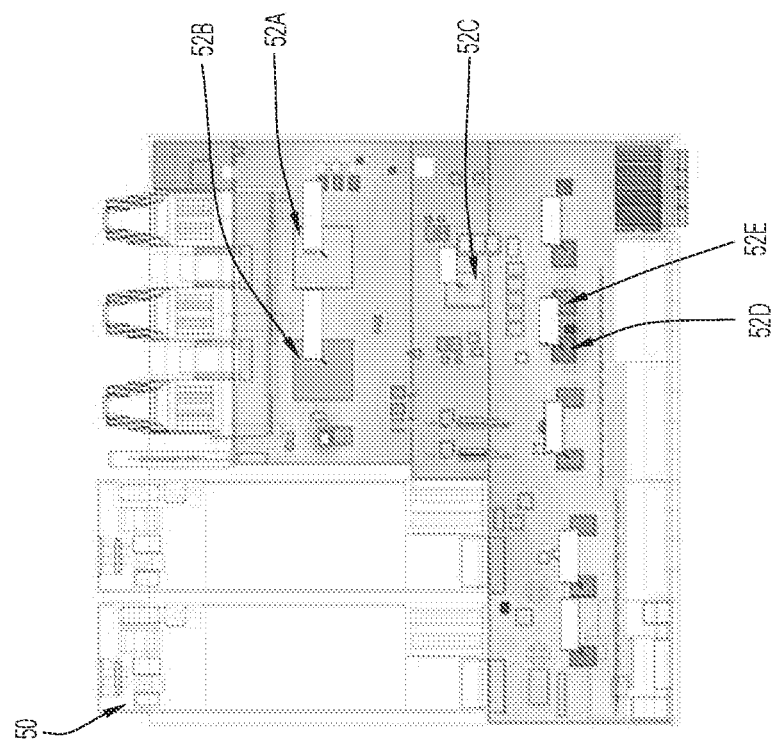
FIG. 14 is a thermal depiction of computing components of the computing device of FIG. 1 when cooled with an embodiment of the ventilation system presented herein.
Figure 13:
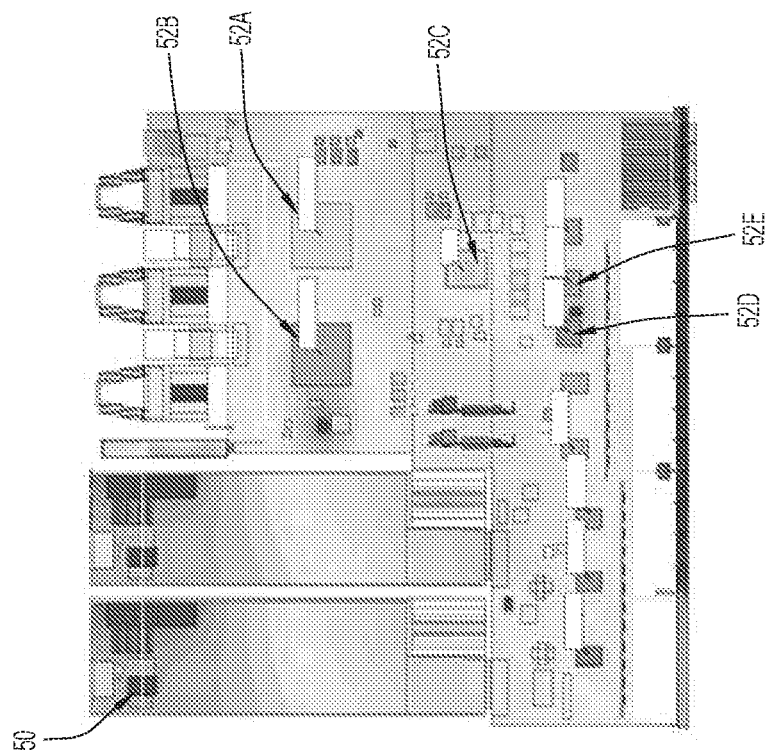
FIG. 13 is a thermal depiction of computing components of the computing device of FIG. 1 when cooled with known ventilation systems.

Now turning to FIGS. 13 and 14 for a description of diagrams that illustrate the thermal gradient of a computing device while including either a machined faceplate or the ventilation solution presented herein, respectively. Initially, FIG. 13 illustrates the thermal gradient of at least key computing components, such as ASIC 52A, ASIC 52B, CPU 52C, ASIC 52D, and ASIC 52E, when the computing device 10 includes a machined, metal faceplate that provides a 60% open air ratio in the ventilation area. With this faceplate, ASIC 52A is maintained at approximately 103° C., ASIC 52B is maintained at approximately 113° C., CPU 52C is maintained at approximately 91° C., ASIC 52D is maintained at approximately 110° C., and ASIC 52E is maintained at approximately 106° C.

By comparison, FIG. 14 illustrates the thermal gradient of at least the same key computing components when the computing device 10 includes an embodiment of the ventilation solution presented herein, which provides an open air ratio in the ventilation area of approximately 85% (e.g., the EMI containment component provides a 95% open air ratio relative to the ventilation openings 120 and the faceplate, which in turn provides a 90% open air ratio relative to the ventilation area 24, so overall the EMI containment component provides an open air ratio of 85% with respect to the ventilation area 24). With this faceplate, ASIC 52A is maintained at approximately 101° C. (providing a delta of −2° C.), ASIC 52B is maintained at approximately 104° C. (providing a delta of −9° C.), CPU 52C is maintained at approximately 86° C. (providing a delta of −9° C.), ASIC 52D is maintained at approximately 108° C. (providing a delta of −2° C.), and ASIC 52E is maintained at approximately 105° C. (providing a delta of −1° C.). Notably, although these temperature differences (i.e., the deltas) may seem relatively small, they are quite significant for cooling computing components 50 of a computing device 10, especially in view of the ever-increasing density of computing components included in modern technology and the ever-increasing amount of heat output by these components.

Figure 15:
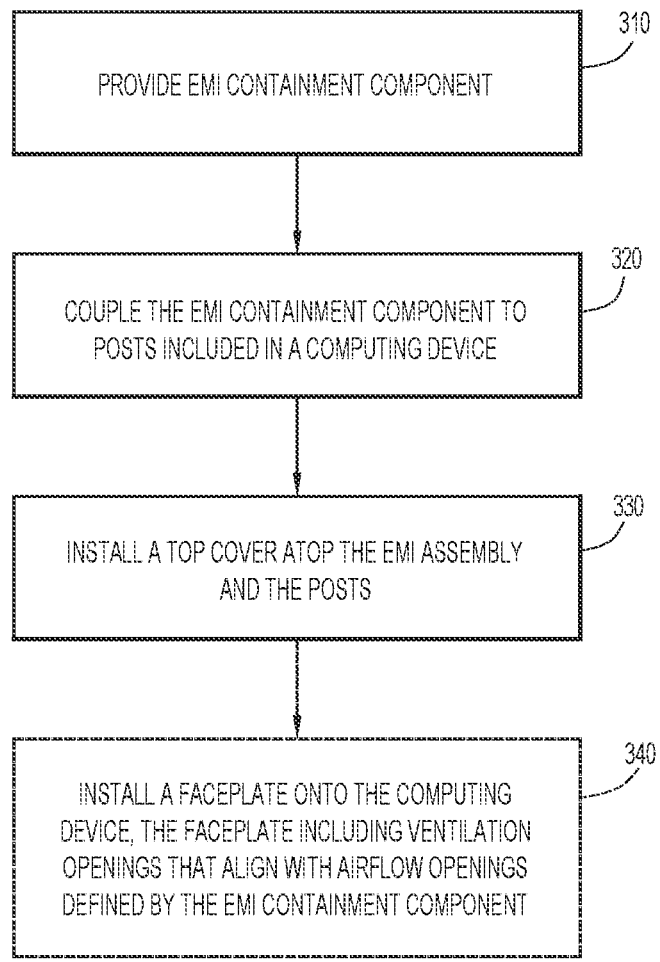
FIG. 15 is a flowchart of a method for installing an EMI containment component on a computing device, according to an example embodiment.
Figure 16:
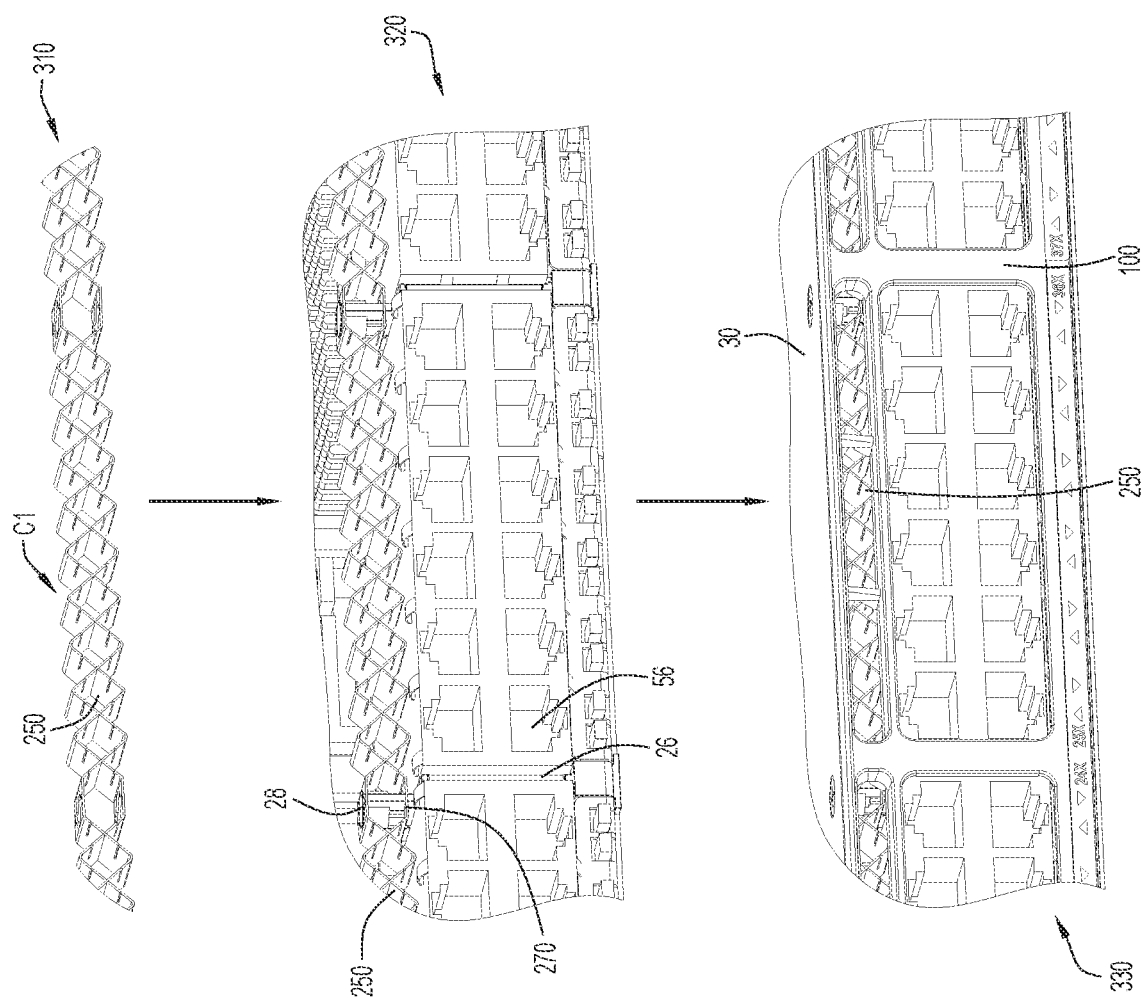
FIGS. 16 and 17 are diagrams depicting the method of FIG. 15 with the EMI containment component of FIG. 6 in two different configurations.
Figure 17:
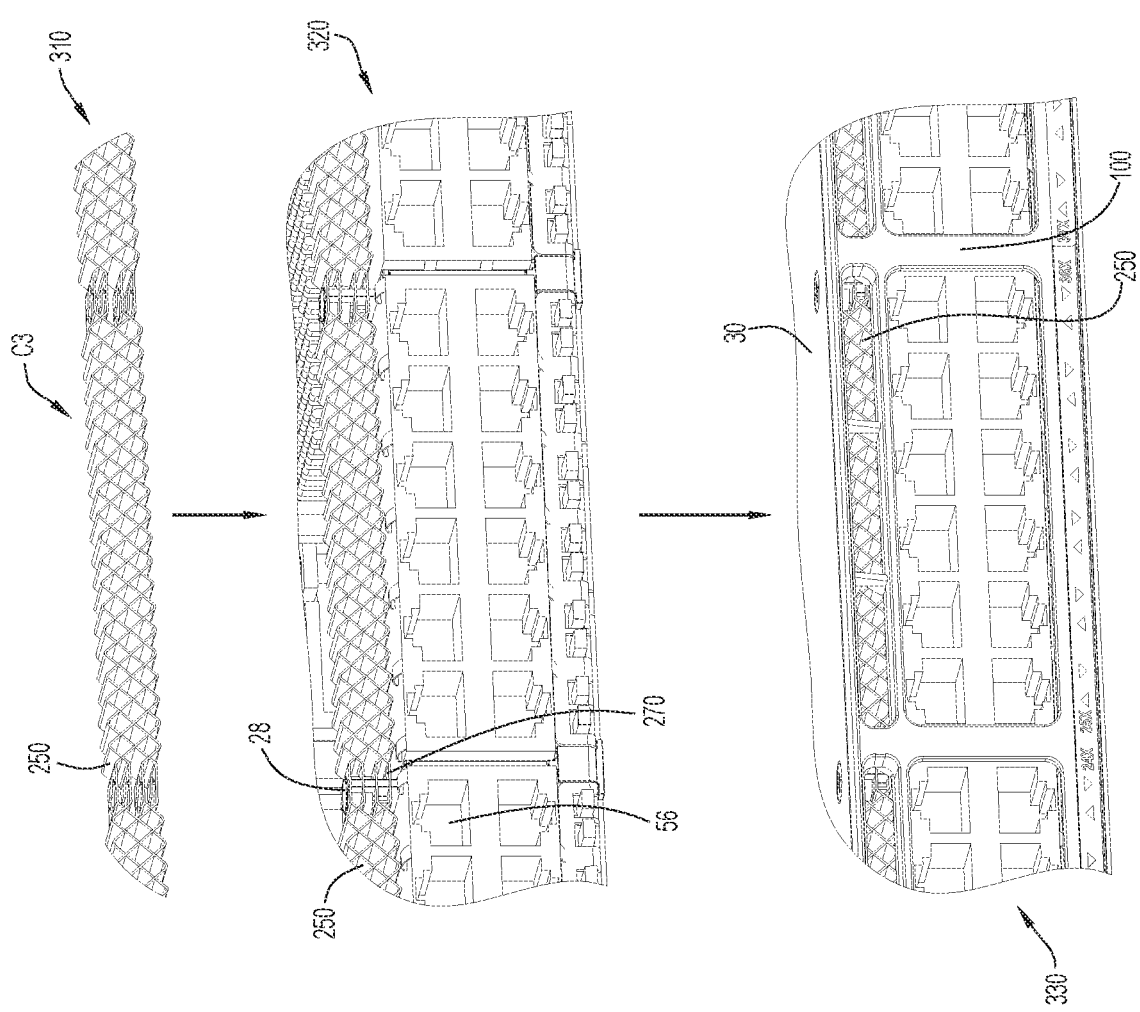

Now turning to FIGS. 15-17 for a description of a high-level method 300 for installing the ventilation solution provided herein. In at least some embodiments, the method 300 is a tool-less method and the ventilation solution (i.e., the EMI containment component, the posts, and the faceplate) can be installed into a computing device with friction fits, snap fits, detents, and other such tool-less connections. Alternatively, the ventilation solution might be installed with fasteners, adhesives, tools, etc. However, either way, no installation-specific tools are required for installing the ventilation solution presented herein.

Initially, at 310, an EMI containment component, such as EMI containment component 200 or EMI containment component 250 is provided. The EMI containment component may be selected or configured based on the frequency at which a system is operating. That is, the EMI containment component can be provided, selected, and/or configured to optimize EMI shielding effectiveness for a particular computing component without negatively impacting thermal performance.

For example, the number of strips included in the EMI containment component may be selected based on operating parameters of the computing component on which it will be included. As specific examples, in FIG. 16, the EMI containment component 250 is provided in its first configuration C1 at step 310. By comparison, in FIG. 17, the EMI containment component 250 is provided in its third configuration C3 at step 310. In addition to or as an alternative to selecting the number of strips, the EMI containment component can be manufactured with a specific pattern, height, thickness, pitch, spacing, spring force, and/or materials in view of the specifications of a particular computing device. For example, a laminated stamping die set can be modified to customize any of the aforementioned features. Then, the stamping die set can bend and slit metal to provide a strip for an EMI containment component with any specific dimensions. Alternatively, metal strips can be formed into any shape, with any features, in any desired manner. Regardless of how the EMI containment component is formed/manufactured, the EMI containment component enhances airflow through the ventilation area, instead of inhibiting airflow through the ventilation area like typical industry designs, such as solid gaskets, unbroken spring finger stock, and perforated patterns in fixed sheet metal panels.

At 320, the EMI containment component is coupled to posts included in the computing device. For example, in FIGS. 16 and 17, engagement segments 270 of the strips included in the EMI containment component 250 (strips 252 and 254 in FIG. 16 and strips 252, 254, 256, and 258 in FIG. 17) are coupled to a slotted flange 29 included on an engagement end 28 of posts 26, as is discussed in detail above. The posts 26 secure the EMI containment component 250 within a ventilation area 24 of the computing device 10 and help prevent the EMI containment component resist moving (e.g., swaying or bending) when a cooling media is drawn into the computing component via the ventilation area (e.g., by fans). In some embodiments, the EMI containment component may also be coupled to other components of the computing device, such as IOMs 56, in order to secure the EMI containment component in place in the ventilation area 24 of a computing device 10.

At 330, a top cover is installed atop the EMI containment component. In the embodiments depicted in FIGS. 16 and 17, the top cover 30 is secured onto an exterior portion of the housing 11 (see, e.g., FIG. 2) and is also secured to the posts 26. Thus, in the depicted embodiments, the EMI containment component 250 is sandwiched between the cover 30 and the IOMs 56. As mentioned, the cover 30, the posts 26, the housing 11, and the EMI containment component 250 are manufactured from metal, such as stainless steel, Zinc, Copper, Beryllium, or any other metals or alloys made therefrom. Thus, securing the cover 30 atop the EMI containment component 250 and the posts 26 may form a complete a Faraday cage around any computing components 52 included in the computing device 10 (see FIG. 2). The Faraday cage may inhibit EMI generated by computing components of the computing device from exiting the computing device.

In some embodiments, a faceplate may also be installed over the front of the computing device at step 340. Since the cover, posts, EMI containment component, and housing of a computing device may complete the Faraday cage for the computing device, the faceplate need not be manufactured from metal. Instead, the faceplate can be formed from plastic, which may provide a significant costs savings as compared to metal faceplates, especially metal faceplates that are machined with perforations. In fact, due to the ventilation solution provided herein, the faceplate may, in at least some embodiments, primarily cover the front of the computing device for aesthetic/cosmetic and/or safety reasons (and, thus, the faceplate may not always be required, so step 340 is shown in dashed lines). However, in some embodiments, the faceplate may also further secure the EMI containment component with respect to a depth direction of the computing device and/or couple a top of an external housing to a bottom of a housing (e.g., the faceplate 100 may couple top cover 30 to base plate 12). Regardless, as is discussed above, since the EMI containment component provides a Faraday cage in the ventilation area of the computing device, the faceplate can include ventilation openings that maximize inlet airflow (e.g., ventilation openings with open air ratios of 90% or more with respect to the ventilation area). The ventilation openings should also be aligned with the airflow openings created by the EMI containment component, as is shown in FIGS. 16 and 17.

If subsequent to installing an EMI containment component in accordance with method 300, the specifications of the computing device on which it is installed change, the EMI containment component can be adjusted accordingly. For example, in some embodiments, the top cover 30 could be removed and additional strip (or two) could be added to the EMI containment component. However, in other embodiments, the EMI containment component may be customized for a computing device prior to installation and may not be adjustable subsequent to installation, perhaps based on the assumption that the EMI containment component will suitable for that specific computing device over the life of that specific computing device.

Figure 18:
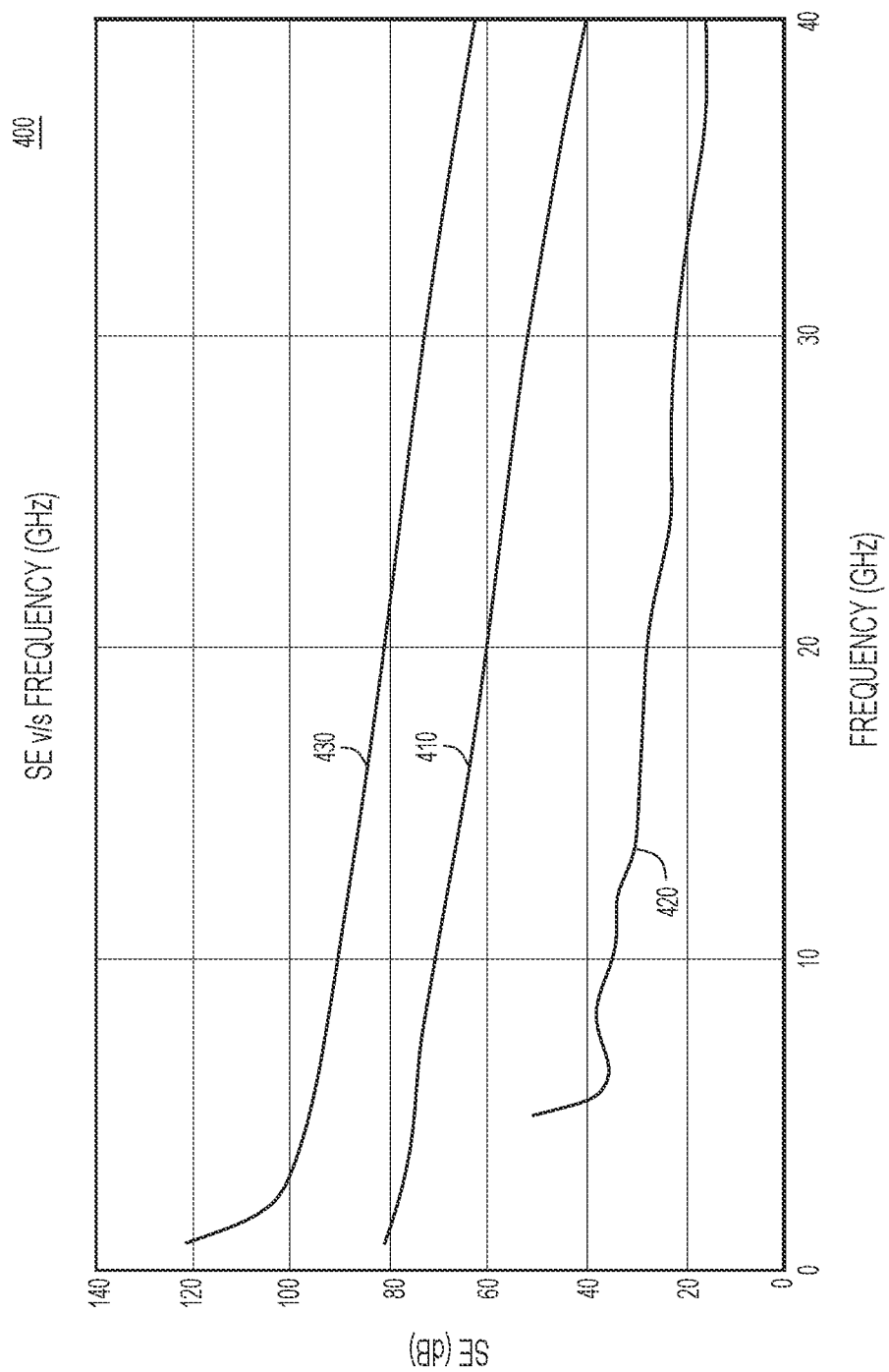
FIG. 18 is a diagram depicting shielding effectiveness of the EMI containment component of FIG. 6.

Now turning to FIG. 18 for a description of a diagram 400 illustrating shielding effectiveness of the ventilation solution provided herein as compared to common ventilation solutions. For brevity, the shielding effectiveness (SE) of only one embodiment of the ventilation solution presented herein—configuration C3 of EMI containment component 250—is shown (at 410) in FIG. 18. For comparison, the shielding effectiveness of a hexagonal perforations included in a metal faceplate is shown at 420 and the shielding effectiveness honeycomb perforations included in a metal faceplate is shown at 430. Notably, configuration C3 of EMI containment component 250 provides slightly less shielding effectiveness than a metal faceplate with honeycomb perforations, but provides more shielding effectiveness than a metal faceplate with hexagonal perforations (by at least 20 decibels (dBs)). Fortunately, the decrease in shielding effectiveness as compared to a metal faceplate with honeycomb perforations does not prevent the EMI containment component from attenuating EMI and, instead, the shielding effectiveness provided EMI containment component is well above industry requirements. Thus, this slight decrease is accepted as a trade-off for the significant increase in thermal performance, as discussed above in connection with at least FIGS. 13 and 14.

Moreover, since at least some embodiments of the EMI containment component presented herein are customizable, the EMI containment component can be adjusted based on a known frequency of EMI generated by a computing device. By comparison, machined faceplates are typically produced with tools that require timely and expensive setups and, thus, these faceplates are not customizable (even for higher frequencies where their shielding effectiveness begins to diminish). Thus, instead of relying on a perforated faceplate across a wide range of products, regardless of whether the faceplate provides optimal EMI containment for a given device, the present solution can be tailored for a specific device, for example, by simply adding or subtracting strips to an EMI containment component.

There are several advantages to the ventilation solution presented herein. Most notably, the ventilation solution presented herein provides a solution that greatly enhances thermal cooling for electronic equipment (e.g., computing devices) cooled with forced air without sacrificing EMI attenuation. Moreover, the ventilation solution solves these issues with a solution that is inexpensive to manufacture and straightforward to install. Thus, not only will the ventilation solution presented herein improve thermal cooling performance for a computing device, but it will reduce manufacturing costs and provide tailored EMI containment. At least a portion of the decreased manufacturing costs stem from the exclusion of the faceplate from the Faraday cage. For example, due to its exclusion from the Faraday cage, the faceplate need not be manufactured from metal and, instead, can be manufactured from plastic or any other material. Moreover, the faceplate need not be machined with perforations and, instead, can include unmachined ventilation openings that, for example, can help create an open air ratio of at least 85% in the ventilation area of a computing device.

Still further, since the ventilation solution presented herein improves thermal cooling, it may enable higher performance or higher power solutions to be implemented in smaller footprints. Additionally or alternatively, the ventilation solution presented herein may allow an air-cooled system to run at a higher power and higher performance for a given footprint. The ventilation solution presented herein will also be particular useful for electronic equipment with higher total system power requirements (e.g., at, near, or higher than 1200 W), such as high performance network equipment, since this equipment requires efficient thermal cooling. Moreover, regardless of the operational characteristics of a computing device on which the ventilation solution presented herein is included, the ventilation solution presented herein can be customized to attenuate EMI radiation for that computing device. In some embodiments, this is achieved by adjusting the shape, size, etc. of features (e.g., resilient fingers) included on strips and, in other embodiments, the EMI containment component may be adjusted by adding or removing strips. Either way, the adjustability of the EMI containment component provides an advantage, especially as compared to machined faceplates that cannot be adjusted to be tailored to different specifications.

To summarize, in one form, an apparatus suitable for providing ventilation and electromagnetic interference (EMI) containment for a computing device is provided, the apparatus comprising: a first strip sized to span ventilation openings of a computing device covering; and a second strip that intersects the first strip while also spanning the ventilation openings so that the first strip and the second strip cooperate to define airflow openings within the ventilation openings, the airflow openings being sized to attenuate EMI generated by the computing device.

In at least some of these apparatus embodiments, the second strip may be spaced from the first strip in a depth direction of the computing device and may intersect the first strip across at least a non-depth dimension of the ventilation openings. Alternatively, the second strip may intersect the first strip by overlapping and interlocking with the first strip. In at least some embodiments where the first strip and second strip overlap and interlock, the first strip comprises a plurality of first interlocking segments and the second strip comprises a plurality of second interlocking segments. The plurality of first interlocking segments engage the plurality of second interlocking segments when the first strip and the second strip overlap and interlock.

Still further, in some embodiments where the strips including interlocking segments, segments of the plurality of first interlocking segments each comprise a first main body and first slots arranged along a first edge of the first main body while segments of the plurality of second interlocking segments each comprise a second main body and second slots arranged along a second edge of the second main body. In these embodiments, the first slots are arranged to mate with the second slots when the first strip and the second strip overlap and interlock. Additionally or alternatively, the first strip may comprise one or more first engagement segments disposed between sets of segments from the plurality of first interlocking segments and the second strip may comprise one or more second engagement segments disposed between sets of segments from the plurality of second interlocking segments. In these embodiments, the sets of the second interlocking segments are sized to align the one or more second engagement segments with the one or more first engagement segments when the first strip and the second strip overlap and interlock.

In at least some of the foregoing apparatus embodiments, the first strip and the second strip are shaped to resemble antiphase triangular waveforms. Additionally or alternatively, the EMI may be a first EMI with a first frequency, the airflow openings are first airflow openings, and the apparatus further comprises a third strip that intersects the first strip and the second strip while also spanning the ventilation openings so that the first strip, the second strip, and the third strip cooperate to define at least second airflow openings within the ventilation openings. The second airflow openings are sized to attenuate second EMI of a second frequency generated by the computing device.

In at least some embodiments with a third strip, the apparatus also comprises a fourth strip that intersects the first strip, the second strip, and the third strip while also spanning the ventilation openings so that the first strip, the second strip, the third strip, and the fourth strip cooperate to define at least third airflow openings within the ventilation openings. The third airflow openings being sized to attenuate third EMI of a third frequency generated by the computing device.

In another form, a computing device with enhanced cooling is provided, the computing device comprising: one or more computing components that generate heat and electromagnetic interference (EMI) during operations of the computing device; a ventilation area in fluid communication with the one or more computing components; and an EMI containment component formed from two or more intersecting strips that spans the ventilation area and defines airflow openings within the ventilation area, the airflow openings being sized to attenuate the EMI.

In at least some of these computing device embodiments, the airflow openings provide an open air ratio greater than 90% within the ventilation area. Additionally or alternatively, the computing device may include a faceplate that defines one or more ventilation openings aligned with the ventilation areas. The airflow openings span the ventilation openings and, in at least some embodiments, the one or more ventilation openings are unmachined and form unimpeded conduits between an interior of the computing device and an exterior of the computing device. Additionally or alternatively, the one or more ventilation openings may extend latitudinally across an area of the faceplate.

Still further, in some embodiments of the computing device provided herein, the EMI containment component is a metal component, and the computing device further comprises: a metal covering that extends around at least one of the one or more computing components; and one or more metal posts that secure the EMI containment component within the ventilation area. The EMI containment component, the one or more metal posts, and the metal covering form a Faraday cage around the one or more computing components of the computing device.

In some embodiments of the computing device presented herein, the two or more intersecting strips are spaced in a depth direction of the computing device and intersect across a non-depth dimension of the ventilation area. Alternatively, the two or more intersecting strips may overlap and interlock. Either way, the EMI containment component may be customizable to adjust the size of the airflow openings.

In yet another form, a method is provided, comprising: providing an electromagnetic interference (EMI) containment component formed from two or more intersecting strips; and installing the EMI containment component in a computing device so that the EMI containment component defines airflow openings within ventilation openings of the computing device, the airflow openings being sized to attenuate EMI generated by the computing device.

In at least some embodiments, the method further comprises installing a faceplate over the ventilation openings. The faceplate may define unmachined vents that align with the ventilation openings.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims. For example, as mentioned, the concepts described herein may be utilized for various computing devices and are not only applicable to switches.

What is claimed is:

1. An apparatus suitable for providing ventilation and electromagnetic interference (EMI) containment for a computing device, the apparatus comprising:
a first strip formed from a first plurality of planar segments that are collectively sized to span a width of ventilation openings of a computing device covering; and
a second strip formed from a second plurality of planar segments that are collectively sized to span the width of the ventilation openings, wherein the second strip is aligned with the first strip in a vertical direction of the ventilation openings and intersects the first strip so that the first strip and the second strip cooperate to define airflow openings extending in a depth direction within the ventilation openings, the airflow openings being sized to attenuate EMI generated by the computing device.

2. The apparatus of claim 1, wherein the second strip intersects the first strip by overlapping and interlocking with the first strip.

3. The apparatus of claim 2, wherein:
the first plurality of planar segments comprises a plurality of first interlocking segments; and
the second plurality of planar segments comprises a plurality of second interlocking segments, wherein the plurality of first interlocking segments engage the plurality of second interlocking segments when the first strip and the second strip overlap and interlock.

4. The apparatus of claim 3, wherein:
segments of the plurality of first interlocking segments each comprise a first main body and first slots arranged along a first edge of the first main body;
segments of the plurality of second interlocking segments each comprise a second main body and second slots arranged along a second edge of the second main body; and
the first slots are arranged to mate with the second slots when the first strip and the second strip overlap and interlock.

5. The apparatus of claim 3, wherein:
the first plurality of planar segments further comprises one or more first engagement segments disposed between sets of segments from the plurality of first interlocking segments;
the second plurality of planar segments further comprises one or more second engagement segments disposed between sets of segments from the plurality of second interlocking segments; and
the sets of the second interlocking segments are sized to align the one or more second engagement segments with the one or more first engagement segments when the first strip and the second strip overlap and interlock.

6. The apparatus of claim 1, wherein a shape of the first strip resembles a first triangular waveform, a shape of the second strip resembles a second triangular waveform, and the first triangular waveform and the second triangular waveform are antiphase triangular waveforms.

7. The apparatus of claim 1, wherein the EMI is a first EMI with a first frequency, the airflow openings are first airflow openings, and the apparatus further comprises:
a third strip that intersects the first strip and the second strip while also spanning the width of the ventilation openings so that the first strip, the second strip, and the third strip cooperate to define at least second airflow openings within the ventilation openings, the second airflow openings being sized to attenuate second EMI of a second frequency generated by the computing device.

8. The apparatus of claim 7, further comprising:
a fourth strip that intersects the first strip, the second strip, and the third strip while also spanning the width of the ventilation openings so that the first strip, the second strip, the third strip, and the fourth strip cooperate to define at least third airflow openings within the ventilation openings, the third airflow openings being sized to attenuate third EMI of a third frequency generated by the computing device.

9. A computing device comprising:
one or more computing components that generate heat and electromagnetic interference (EMI) during operations of the computing device;
a ventilation area in fluid communication with the one or more computing components; and
an EMI containment component formed from two or more intersecting strips that are each formed from a plurality of planar segments, wherein the two or more intersecting strips are aligned in a vertical direction of the ventilation area and span a width of the ventilation area so that the two or more intersecting strips define airflow openings extending in a depth direction within the ventilation area, the airflow openings being sized to attenuate the EMI.

10. The computing device of claim 9, wherein the airflow openings provide an open air ratio greater than 90% within the ventilation area.

11. The computing device of claim 9, further comprising, a faceplate that defines one or more ventilation openings aligned with the ventilation area, wherein the airflow openings span the one or more ventilation openings.

12. The computing device of claim 11, wherein the one or more ventilation openings are unmachined and form unimpeded conduits between an interior of the computing device and an exterior of the computing device.

13. The computing device of claim 11, wherein the one or more ventilation openings extend latitudinally across an area of the faceplate.

14. The computing device of claim 9, wherein the EMI containment component is a metal component, and the computing device further comprises:
 a metal covering that extends around at least one of the one or more computing components; and
 one or more metal posts that secure the EMI containment component within the ventilation area, wherein the EMI containment component, the one or more metal posts, and the metal covering form a Faraday cage around the one or more computing components of the computing device.

15. The computing device of claim 9, wherein the two or more intersecting strips overlap and interlock.

16. The computing device of claim 9, wherein the EMI containment component is customizable to adjust a size of the airflow openings.

17. The computing device of claim 9, wherein the two or more intersecting strips include a first strip and a second strip, the first strip having a shape resembling a first triangular waveform, the second strip having a shape resembling a second triangular waveform, and the first triangular waveform and the second triangular waveform are antiphase triangular waveforms.

18. A method comprising:
 providing an electromagnetic interference (EMI) containment component formed from two or more intersecting strips that are each formed from a plurality of planar segments; and
 installing the EMI containment component in a ventilation area of a computing device with the two or more intersecting strips aligned in a vertical direction of the ventilation area while spanning a width of the ventilation area so that the EMI containment component defines airflow openings that extend in a depth direction within ventilation openings of the computing device, the airflow openings being sized to attenuate EMI generated by the computing device.

19. The method of claim 18, further comprising:
 installing a faceplate over the ventilation openings, the faceplate defining unmachined vents that align with the ventilation openings.

20. The method of claim 18, wherein the two or more intersecting strips include a first strip and a second strip, the first strip having a shape resembling a first triangular waveform, the second strip having a shape resembling a second triangular waveform, and the first triangular waveform and the second triangular waveform are antiphase triangular waveforms.

* * * * *